United States Patent
Fondurulia et al.

(10) Patent No.: US 8,986,456 B2
(45) Date of Patent: Mar. 24, 2015

(54) PRECURSOR DELIVERY SYSTEM

(75) Inventors: Kyle Fondurulia, Phoenix, AZ (US); Eric Shero, Phoenix, AZ (US); Mohith E. Verghese, Phoenix, AZ (US); Carl L. White, Gilbert, AZ (US)

(73) Assignee: ASM America, Inc., Phoenix, AZ (US)

( * ) Notice: Subject to any disclaimer, the term of this patent is extended or adjusted under 35 U.S.C. 154(b) by 893 days.

(21) Appl. No.: 12/763,037

(22) Filed: Apr. 19, 2010

(65) Prior Publication Data

US 2010/0322604 A1    Dec. 23, 2010

Related U.S. Application Data

(63) Continuation-in-part of application No. 11/870,374, filed on Oct. 10, 2007, now Pat. No. 8,137,462.

(60) Provisional application No. 60/850,886, filed on Oct. 10, 2006.

(51) Int. Cl.
 *C23C 16/448*    (2006.01)

(52) U.S. Cl.
 CPC .................................. *C23C 16/4481* (2013.01)
 USPC .......................................................... 118/726

(58) Field of Classification Search
 CPC .................................................. C23C 16/4481
 USPC .......................................................... 118/726
 See application file for complete search history.

(56) References Cited

U.S. PATENT DOCUMENTS

| | | |
|---|---|---|
| 2,745,640 A | 5/1956 | Cushman |
| 2,990,045 A | 9/1959 | Root |
| 3,833,492 A | 9/1974 | Bollyky |
| 3,854,443 A | 12/1974 | Baerg |
| 3,862,397 A | 1/1975 | Anderson et al. |
| 3,887,790 A | 6/1975 | Ferguson |
| 4,058,430 A | 11/1977 | Suntola et al. |
| 4,176,630 A | 12/1979 | Elmer |
| 4,194,536 A | 3/1980 | Stine et al. |
| 4,389,973 A | 6/1983 | Suntola et al. |
| 4,393,013 A | 7/1983 | McMenamin |
| 4,436,674 A | 3/1984 | McMenamin |
| 4,570,328 A | 2/1986 | Price et al. |

(Continued)

FOREIGN PATENT DOCUMENTS

| | | |
|---|---|---|
| CN | 1563483 A | 12/2006 |
| CN | 101330015 | 12/2008 |

(Continued)

OTHER PUBLICATIONS

USPTO; Office Action dated Feb. 15, 2011 in U.S. Appl. No. 12/118,596.

(Continued)

*Primary Examiner* — Jeffrie R Lund

(74) *Attorney, Agent, or Firm* — Snell & Wilmer LLP

(57) ABSTRACT

A precursor source vessel for providing vaporized precursor to a reaction chamber is provided. The precursor source vessel includes a lid having a first port, a second port, and a third port. The precursor source vessel also includes a base removably attached to the lid. The base includes a recessed region formed therein. One of the first, second, and third ports is a burp port configured to relieve the head pressure within the source vessel after the source vessel is installed but prior to use of the source vessel in semiconductor processing.

25 Claims, 30 Drawing Sheets

(56) References Cited

U.S. PATENT DOCUMENTS

| | | |
|---|---|---|
| 4,653,541 A | 3/1987 | Oehlschlaeger et al. |
| 4,722,298 A | 2/1988 | Rubin et al. |
| 4,735,259 A | 4/1988 | Vincent |
| 4,753,192 A | 6/1988 | Goldsmith et al. |
| 4,789,294 A | 12/1988 | Sato et al. |
| 4,821,674 A | 4/1989 | deBoer et al. |
| 4,827,430 A | 5/1989 | Aid et al. |
| 4,991,614 A | 2/1991 | Hammel |
| 5,062,386 A | 11/1991 | Christensen |
| 5,119,760 A | 6/1992 | McMillan et al. |
| 5,167,716 A | 12/1992 | Boitnott et al. |
| 5,199,603 A * | 4/1993 | Prescott ............................ 222/3 |
| 5,221,556 A | 6/1993 | Hawkins et al. |
| 5,242,539 A | 9/1993 | Kumihashi et al. |
| 5,243,195 A | 9/1993 | Nishi |
| 5,326,427 A | 7/1994 | Jerbic |
| 5,380,367 A * | 1/1995 | Bertone ...................... 118/726 |
| 5,595,606 A | 1/1997 | Fujikawa et al. |
| 5,632,919 A | 5/1997 | MacCracken et al. |
| 5,730,801 A | 3/1998 | Tepman |
| 5,732,744 A | 3/1998 | Barr et al. |
| 5,736,314 A | 4/1998 | Hayes et al. |
| 5,796,074 A | 8/1998 | Edelstein et al. |
| 5,836,483 A * | 11/1998 | Disel ............................ 222/396 |
| 5,855,680 A | 1/1999 | Soininen et al. |
| 5,979,506 A | 11/1999 | Aarseth |
| 6,013,553 A | 1/2000 | Wallace |
| 6,015,465 A | 1/2000 | Kholodenko et al. |
| 6,060,691 A | 5/2000 | Minami et al. |
| 6,083,321 A | 7/2000 | Lei et al. |
| 6,086,677 A | 7/2000 | Umotoy et al. |
| 6,122,036 A | 9/2000 | Yamasaki et al. |
| 6,125,789 A | 10/2000 | Gupta et al. |
| 6,129,044 A | 10/2000 | Zhao et al. |
| 6,148,761 A | 11/2000 | Majewski et al. |
| 6,161,500 A | 12/2000 | Kopacz et al. |
| 6,274,878 B1 | 8/2001 | Li et al. |
| 6,287,965 B1 | 9/2001 | Kang et al. |
| 6,302,964 B1 | 10/2001 | Umotoy et al. |
| 6,312,525 B1 | 11/2001 | Bright et al. |
| 6,326,597 B1 | 12/2001 | Lubomirsky et al. |
| 6,342,427 B1 | 1/2002 | Choi et al. |
| 6,367,410 B1 | 4/2002 | Leahey et al. |
| 6,368,987 B1 | 4/2002 | Kopacz et al. |
| 6,420,279 B1 | 7/2002 | Ono et al. |
| 6,454,860 B2 | 9/2002 | Metzner et al. |
| 6,478,872 B1 | 11/2002 | Chae et al. |
| 6,482,331 B2 | 11/2002 | Lu et al. |
| 6,483,989 B1 | 11/2002 | Okada et al. |
| 6,511,539 B1 | 1/2003 | Raaijmakers |
| 6,569,239 B2 | 5/2003 | Arai et al. |
| 6,590,251 B2 | 7/2003 | Kang et al. |
| 6,594,550 B1 | 7/2003 | Okrah |
| 6,598,559 B1 | 7/2003 | Vellore et al. |
| 6,627,503 B2 | 9/2003 | Ma et al. |
| 6,648,974 B1 | 11/2003 | Ogliari et al. |
| 6,682,973 B1 | 1/2004 | Paton et al. |
| 6,710,364 B2 | 3/2004 | Guldi et al. |
| 6,734,090 B2 | 5/2004 | Agarwala et al. |
| 6,820,570 B2 | 11/2004 | Kilpela et al. |
| 6,821,910 B2 | 11/2004 | Adomaitis et al. |
| 6,824,665 B2 | 11/2004 | Shelnut et al. |
| 6,847,014 B1 | 1/2005 | Benjamin et al. |
| 6,858,547 B2 | 2/2005 | Metzner |
| 6,863,019 B2 | 3/2005 | Shamouilian |
| 6,874,480 B1 | 4/2005 | Ismailov |
| 6,875,677 B1 | 4/2005 | Conley, Jr. et al. |
| 6,884,066 B2 | 4/2005 | Nguyen et al. |
| 6,889,864 B2 | 5/2005 | Lindfors et al. |
| 6,909,839 B2 | 6/2005 | Wang et al. |
| 6,930,059 B2 | 8/2005 | Conley, Jr. et al. |
| 6,935,269 B2 | 8/2005 | Lee et al. |
| 7,045,430 B2 | 5/2006 | Ahn et al. |
| 7,053,009 B2 | 5/2006 | Conley, Jr. et al. |
| 7,071,051 B1 | 7/2006 | Jeon et al. |
| 7,115,838 B2 | 10/2006 | Kurara et al. |
| 7,122,085 B2 * | 10/2006 | Shero et al. ................... 118/726 |
| 7,129,165 B2 | 10/2006 | Basol et al. |
| 7,132,360 B2 | 11/2006 | Schaeffer et al. |
| 7,135,421 B2 | 11/2006 | Ahn et al. |
| 7,147,766 B2 | 12/2006 | Uzoh et al. |
| 7,172,497 B2 | 2/2007 | Basol et al. |
| 7,192,824 B2 | 3/2007 | Ahn et al. |
| 7,192,892 B2 | 3/2007 | Ahn et al. |
| 7,195,693 B2 | 3/2007 | Cowans |
| 7,204,887 B2 | 4/2007 | Kawamura et al. |
| 7,205,247 B2 | 4/2007 | Lee et al. |
| 7,235,501 B2 | 6/2007 | Ahn et al. |
| 7,312,494 B2 | 12/2007 | Ahn et al. |
| 7,329,947 B2 | 2/2008 | Adachi et al. |
| 7,357,138 B2 | 4/2008 | Ji et al. |
| 7,393,736 B2 | 7/2008 | Ahn et al. |
| 7,402,534 B2 | 7/2008 | Mahajani |
| 7,405,166 B2 | 7/2008 | Liang et al. |
| 7,405,454 B2 | 7/2008 | Ahn et al. |
| 7,414,281 B1 | 8/2008 | Fastow |
| 7,437,060 B2 | 10/2008 | Wang et al. |
| 7,442,275 B2 | 10/2008 | Cowans |
| 7,547,363 B2 * | 6/2009 | Tomiyasu et al. ............ 118/726 |
| 7,601,223 B2 | 10/2009 | Lindfors et al. |
| 7,601,225 B2 * | 10/2009 | Tuominen et al. ............ 118/726 |
| 7,640,142 B2 | 12/2009 | Tachikawa et al. |
| 7,651,583 B2 | 1/2010 | Kent et al. |
| D614,153 S * | 4/2010 | Fondurulia et al. .......... D13/182 |
| 7,723,648 B2 | 5/2010 | Tsukamoto et al. |
| 7,740,705 B2 | 6/2010 | Li |
| 7,780,440 B2 | 8/2010 | Shibagaki et al. |
| 7,833,353 B2 | 11/2010 | Furukawahara et al. |
| 7,851,019 B2 * | 12/2010 | Tuominen et al. ........ 427/255.23 |
| 7,884,918 B2 | 2/2011 | Hattori |
| 8,041,197 B2 | 10/2011 | Kasai et al. |
| 8,071,451 B2 | 12/2011 | Berry |
| 8,071,452 B2 | 12/2011 | Raisanen |
| 8,072,578 B2 | 12/2011 | Yasuda |
| 8,076,230 B2 | 12/2011 | Wei |
| 8,082,946 B2 * | 12/2011 | Laverdiere et al. ......... 137/487.5 |
| 8,092,604 B2 * | 1/2012 | Tomiyasu et al. ............. 118/726 |
| 8,137,462 B2 * | 3/2012 | Fondurulia et al. ........... 118/715 |
| 8,147,242 B2 | 4/2012 | Shibagaki et al. |
| 8,216,380 B2 | 7/2012 | White et al. |
| 8,278,176 B2 | 10/2012 | Bauer et al. |
| 8,282,769 B2 | 10/2012 | Iizuka |
| 8,287,648 B2 | 10/2012 | Reed et al. |
| 8,293,016 B2 * | 10/2012 | Bahng et al. ................... 118/725 |
| 8,309,173 B2 * | 11/2012 | Tuominen et al. ........ 427/255.23 |
| 8,367,528 B2 | 2/2013 | Bauer et al. |
| 8,444,120 B2 * | 5/2013 | Gregg et al. .................... 261/142 |
| 8,608,885 B2 | 12/2013 | Goto et al. |
| 8,683,943 B2 | 4/2014 | Onodera et al. |
| 8,711,338 B2 | 4/2014 | Liu et al. |
| 8,726,837 B2 | 5/2014 | Patalay et al. |
| 8,728,832 B2 | 5/2014 | Raisanen et al. |
| 8,802,201 B2 | 8/2014 | Raisanen et al. |
| 8,821,640 B2 * | 9/2014 | Cleary et al. ................... 118/726 |
| 8,877,655 B2 | 11/2014 | Shero et al. |
| 8,883,270 B2 | 11/2014 | Shero et al. |
| 2002/0001974 A1 | 1/2002 | Chan |
| 2002/0011210 A1 | 1/2002 | Satoh et al. |
| 2002/0064592 A1 | 5/2002 | Datta et al. |
| 2002/0108670 A1 | 8/2002 | Baker et al. |
| 2002/0115252 A1 | 8/2002 | Haukka et al. |
| 2002/0172768 A1 | 11/2002 | Endo et al. |
| 2002/0187650 A1 | 12/2002 | Blalock et al. |
| 2003/0019580 A1 | 1/2003 | Strang |
| 2003/0042419 A1 | 3/2003 | Katsumata et al. |
| 2003/0066826 A1 | 4/2003 | Lee et al. |
| 2003/0075925 A1 * | 4/2003 | Lindfors et al. ............... 285/367 |
| 2003/0111963 A1 | 6/2003 | Tolmachev et al. |
| 2003/0141820 A1 | 7/2003 | White et al. |
| 2003/0228772 A1 | 12/2003 | Cowans |
| 2003/0232138 A1 * | 12/2003 | Tuominen et al. .......... 427/248.1 |
| 2004/0013577 A1 * | 1/2004 | Ganguli et al. ................ 422/129 |
| 2004/0023516 A1 | 2/2004 | Londergan et al. |
| 2004/0144980 A1 | 7/2004 | Ahn et al. |

(56) References Cited

U.S. PATENT DOCUMENTS

| | | |
|---|---|---|
| 2004/0168627 A1 | 9/2004 | Conley et al. |
| 2004/0169032 A1 | 9/2004 | Murayama et al. |
| 2004/0198069 A1 | 10/2004 | Metzner et al. |
| 2004/0200499 A1 | 10/2004 | Harvey et al. |
| 2004/0219793 A1 | 11/2004 | Hishiya et al. |
| 2004/0221807 A1 | 11/2004 | Verghese et al. |
| 2004/0266011 A1 | 12/2004 | Lee et al. |
| 2005/0008799 A1* | 1/2005 | Tomiyasu et al. ............ 428/34.1 |
| 2005/0019026 A1 | 1/2005 | Wang et al. |
| 2005/0020071 A1 | 1/2005 | Sonobe et al. |
| 2005/0023624 A1 | 2/2005 | Ahn et al. |
| 2005/0054228 A1 | 3/2005 | March |
| 2005/0066893 A1* | 3/2005 | Soininen ...................... 118/715 |
| 2005/0070123 A1 | 3/2005 | Hirano |
| 2005/0072357 A1* | 4/2005 | Shero et al. .................. 118/715 |
| 2005/0092249 A1 | 5/2005 | Kilpela et al. |
| 2005/0100669 A1 | 5/2005 | Kools et al. |
| 2005/0110069 A1 | 5/2005 | Kil et al. |
| 2005/0173003 A1* | 8/2005 | Laverdiere et al. ........ 137/487.5 |
| 2005/0212119 A1 | 9/2005 | Shero |
| 2005/0214457 A1 | 9/2005 | Schmitt et al. |
| 2005/0214458 A1 | 9/2005 | Meiere |
| 2005/0218462 A1 | 10/2005 | Ahn et al. |
| 2005/0229972 A1 | 10/2005 | Hoshi et al. |
| 2005/0241176 A1 | 11/2005 | Shero et al. |
| 2005/0263075 A1 | 12/2005 | Wang et al. |
| 2005/0271813 A1 | 12/2005 | Kher et al. |
| 2005/0282101 A1 | 12/2005 | Adachi |
| 2006/0013946 A1 | 1/2006 | Park et al. |
| 2006/0019033 A1 | 1/2006 | Muthukrishnan et al. |
| 2006/0024439 A2* | 2/2006 | Tuominen et al. ......... 427/248.1 |
| 2006/0046518 A1 | 3/2006 | Hill et al. |
| 2006/0051925 A1 | 3/2006 | Ahn et al. |
| 2006/0060930 A1 | 3/2006 | Metz et al. |
| 2006/0062910 A1 | 3/2006 | Meiere |
| 2006/0110934 A1 | 5/2006 | Fukuchi |
| 2006/0113675 A1 | 6/2006 | Chang et al. |
| 2006/0128168 A1 | 6/2006 | Ahn et al. |
| 2006/0148180 A1 | 7/2006 | Ahn et al. |
| 2006/0193979 A1 | 8/2006 | Meiere et al. |
| 2006/0208215 A1 | 9/2006 | Metzner et al. |
| 2006/0213439 A1 | 9/2006 | Ishizaka |
| 2006/0223301 A1 | 10/2006 | Vanhaelemeersch et al. |
| 2006/0226117 A1 | 10/2006 | Bertram et al. |
| 2006/0228888 A1 | 10/2006 | Lee et al. |
| 2006/0240574 A1 | 10/2006 | Yoshie |
| 2006/0257563 A1 | 11/2006 | Doh et al. |
| 2006/0258078 A1 | 11/2006 | Lee et al. |
| 2006/0266289 A1 | 11/2006 | Verghese et al. |
| 2007/0022954 A1 | 2/2007 | Iizuka et al. |
| 2007/0028842 A1 | 2/2007 | Inagawa et al. |
| 2007/0031599 A1 | 2/2007 | Gschwandtner et al. |
| 2007/0037412 A1 | 2/2007 | Dip et al. |
| 2007/0042117 A1 | 2/2007 | Kuppurao et al. |
| 2007/0049053 A1 | 3/2007 | Mahajani |
| 2007/0059948 A1 | 3/2007 | Metzner et al. |
| 2007/0065578 A1 | 3/2007 | McDougall |
| 2007/0066010 A1 | 3/2007 | Ando |
| 2007/0077355 A1 | 4/2007 | Chacin et al. |
| 2007/0084405 A1 | 4/2007 | Kim |
| 2007/0116873 A1 | 5/2007 | Li et al. |
| 2007/0134942 A1 | 6/2007 | Ahn et al. |
| 2007/0146621 A1 | 6/2007 | Yeom |
| 2007/0155138 A1 | 7/2007 | Tomasini et al. |
| 2007/0166457 A1* | 7/2007 | Yamoto et al. ............. 427/248.1 |
| 2007/0175397 A1* | 8/2007 | Tomiyasu et al. ............ 118/726 |
| 2007/0209590 A1 | 9/2007 | Li |
| 2007/0232501 A1 | 10/2007 | Tonomura |
| 2007/0249131 A1 | 10/2007 | Allen et al. |
| 2007/0252244 A1 | 11/2007 | Srividya et al. |
| 2007/0264807 A1 | 11/2007 | Leone et al. |
| 2008/0006208 A1 | 1/2008 | Ueno et al. |
| 2008/0029790 A1 | 2/2008 | Ahn et al. |
| 2008/0054332 A1 | 3/2008 | Kim et al. |
| 2008/0057659 A1 | 3/2008 | Forbes et al. |
| 2008/0075881 A1 | 3/2008 | Won et al. |
| 2008/0085226 A1 | 4/2008 | Fondurulia et al. |
| 2008/0124908 A1 | 5/2008 | Forbes et al. |
| 2008/0149031 A1 | 6/2008 | Chu et al. |
| 2008/0176375 A1 | 7/2008 | Erben et al. |
| 2008/0216077 A1 | 9/2008 | Emani et al. |
| 2008/0224240 A1 | 9/2008 | Ahn et al. |
| 2008/0233288 A1 | 9/2008 | Clark |
| 2008/0261413 A1 | 10/2008 | Mahajani |
| 2008/0282970 A1 | 11/2008 | Heys et al. |
| 2009/0000550 A1 | 1/2009 | Tran et al. |
| 2009/0011608 A1 | 1/2009 | Nabatame |
| 2009/0020072 A1* | 1/2009 | Mizunaga et al. ............ 118/719 |
| 2009/0035947 A1 | 2/2009 | Horii |
| 2009/0061644 A1 | 3/2009 | Chiang et al. |
| 2009/0085156 A1 | 4/2009 | Dewey et al. |
| 2009/0095221 A1 | 4/2009 | Tam et al. |
| 2009/0107404 A1 | 4/2009 | Ogliari et al. |
| 2009/0136668 A1 | 5/2009 | Gregg et al. |
| 2009/0211523 A1 | 8/2009 | Kuppurao et al. |
| 2009/0211525 A1* | 8/2009 | Sarigiannis et al. .......... 118/707 |
| 2009/0239386 A1 | 9/2009 | Suzaki et al. |
| 2009/0242957 A1 | 10/2009 | Ma et al. |
| 2009/0246374 A1 | 10/2009 | Vukovic |
| 2009/0261331 A1 | 10/2009 | Yang et al. |
| 2009/0277510 A1 | 11/2009 | Shikata |
| 2009/0283041 A1* | 11/2009 | Tomiyasu et al. ............. 118/726 |
| 2010/0024727 A1 | 2/2010 | Kim et al. |
| 2010/0025796 A1 | 2/2010 | Dabiran |
| 2010/0055312 A1 | 3/2010 | Kato et al. |
| 2010/0124610 A1 | 5/2010 | Aikawa et al. |
| 2010/0130017 A1 | 5/2010 | Luo et al. |
| 2010/0170441 A1 | 7/2010 | Won et al. |
| 2010/0193501 A1 | 8/2010 | Zucker et al. |
| 2010/0230051 A1 | 9/2010 | Iizuka |
| 2010/0255198 A1* | 10/2010 | Cleary et al. ............. 427/255.39 |
| 2010/0275846 A1 | 11/2010 | Kitagawa |
| 2010/0294199 A1 | 11/2010 | Tran et al. |
| 2010/0307415 A1 | 12/2010 | Shero et al. |
| 2010/0322604 A1* | 12/2010 | Fondurulia et al. ........... 392/451 |
| 2011/0000619 A1 | 1/2011 | Suh |
| 2011/0061810 A1 | 3/2011 | Ganguly et al. |
| 2011/0070380 A1 | 3/2011 | Shero et al. |
| 2011/0097901 A1 | 4/2011 | Banna et al. |
| 2011/0108194 A1 | 5/2011 | Yoshioka et al. |
| 2011/0236600 A1 | 9/2011 | Fox et al. |
| 2011/0239936 A1 | 10/2011 | Suzaki et al. |
| 2011/0256734 A1 | 10/2011 | Hausmann et al. |
| 2011/0275166 A1 | 11/2011 | Shero et al. |
| 2011/0308460 A1 | 12/2011 | Hong et al. |
| 2012/0024479 A1 | 2/2012 | Palagashvili et al. |
| 2012/0070997 A1 | 3/2012 | Larson |
| 2012/0090704 A1* | 4/2012 | Laverdiere et al. ........ 137/487.5 |
| 2012/0098107 A1 | 4/2012 | Raisanen et al. |
| 2012/0114877 A1 | 5/2012 | Lee |
| 2012/0156108 A1* | 6/2012 | Fondurulia et al. ............ 422/187 |
| 2012/0160172 A1* | 6/2012 | Wamura et al. ............... 118/726 |
| 2012/0240858 A1* | 9/2012 | Taniyama et al. ............. 118/726 |
| 2012/0289053 A1 | 11/2012 | Holland et al. |
| 2012/0295427 A1 | 11/2012 | Bauer |
| 2012/0304935 A1* | 12/2012 | Oosterlaken et al. ......... 118/726 |
| 2013/0023129 A1 | 1/2013 | Reed |
| 2013/0104988 A1 | 5/2013 | Yednak et al. |
| 2013/0104992 A1 | 5/2013 | Yednak et al. |
| 2013/0126515 A1 | 5/2013 | Shero et al. |
| 2013/0129577 A1 | 5/2013 | Halpin et al. |
| 2013/0230814 A1 | 9/2013 | Dunn et al. |
| 2013/0264659 A1 | 10/2013 | Jung |
| 2013/0292676 A1 | 11/2013 | Milligan et al. |
| 2013/0292807 A1 | 11/2013 | Raisanen et al. |
| 2014/0000843 A1 | 1/2014 | Dunn et al. |
| 2014/0027884 A1 | 1/2014 | Fang et al. |
| 2014/0036274 A1 | 2/2014 | Marquardt et al. |
| 2014/0060147 A1 | 3/2014 | Sarin et al. |
| 2014/0067110 A1 | 3/2014 | Lawson et al. |
| 2014/0073143 A1 | 3/2014 | Alokozai et al. |
| 2014/0084341 A1 | 3/2014 | Weeks |
| 2014/0103145 A1 | 4/2014 | White et al. |
| 2014/0120487 A1 | 5/2014 | Kaneko |

(56) References Cited

U.S. PATENT DOCUMENTS

| | | | |
|---|---|---|---|
| 2014/0159170 A1 | 6/2014 | Raisanen et al. |
| 2014/0175054 A1 | 6/2014 | Carlson et al. |
| 2014/0217065 A1 | 8/2014 | Winkler et al. |
| 2014/0220247 A1 | 8/2014 | Haukka et al. |
| 2014/0251953 A1 | 9/2014 | Winkler et al. |
| 2014/0251954 A1 | 9/2014 | Winkler et al. |
| 2014/0346650 A1 | 11/2014 | Raisanen et al. |

FOREIGN PATENT DOCUMENTS

| | | | |
|---|---|---|---|
| CN | 101423937 A | 9/2011 | |
| JP | 07283149 | 10/1995 | |
| JP | 08335558 | 12/1996 | |
| JP | 2001342570 | 12/2001 | |
| JP | 2004014952 A | 1/2004 | |
| JP | 2004091848 | 3/2004 | |
| JP | 2004538374 | 12/2004 | |
| JP | 2005507030 | 3/2005 | |
| JP | 2006186271 | 7/2006 | |
| JP | 2008527448 | 7/2008 | |
| TW | 200701301 A | 1/2007 | |
| WO | 2006/056091 A1 | 6/2006 | |
| WO | 2006/078666 | 7/2006 | |

OTHER PUBLICATIONS

PCT; International Search report and Written Opinion dated Nov. 12, 2010 in Application No. PCT/US2010/030126.
PCT; International Search report and Written Opinion dated Jan. 12, 2011 in Application No. PCT/US2010/045368.
Chang et al. Small-Subthreshold-Swing and Low-Voltage Flexible Organic Thin-Film Transistors Which Use HfLaO as the Gate Dielectric; IEEE Electron Device Letters; Feb. 2009; 133-135; vol. 30, No. 2; IEEE Electron Device Society.
Maeng et al. Electrical properties of atomic layer disposition Hf02 and Hf0xNy on Si substrates with various crystal orientations, Journal of the Electrochemical Society, Apr. 2008, p. H267-H271, vol. 155, No. 4, Department of Materials Science and Engineering, Pohang University of Science and Technology, Pohang, Korea.
USPTO; Office Action dated Aug. 27, 2010 in U.S. Appl. No. 12/118,596.
USPTO; Notice of Allowance dated Aug. 4, 2011 in U.S. Appl. No. 12/118,596.
USPTO; Notice of Allowance dated Jun. 16, 2011 in U.S. Appl. No. 12/430,751.
USPTO; Notice of Allowance dated Jul. 27, 2011 in U.S. Appl. No. 12/430,751.
USPTO; Office Action dated Jan. 15, 2013 in U.S. Appl. No. 12/754,223.
PCT; International Search report and Written Opinion dated Feb. 6, 2013 in Application No. PCT/US2012/065343.
PCT; International Search report and Written Opinion dated Feb. 13, 2013 in Application No. PCT/US2012/065347.
Chinese Patent Office; Office Action dated Jan. 10, 2013 is Serial No. 201080015699.9.
Novaro et al. Theoretical Study on a Reaction Pathway of Ziegler-Natta-Type Catalysis, J. Chem. Phys. 68(5), Mar. 1, 1978 p. 2337-2351.
USPTO; Office Action dated Feb. 26, 2013 in U.S. Appl. No. 12/754,223.
USPTO; Final Office Action dated Jun. 28, 2013 in U.S. Appl. No. 12/754,223.
USPTO; Office Action dated Feb. 25, 2014 in U.S. Appl. No. 12/754,223.
USPTO; Restriction Requirement dated Sep. 25, 2012 in U.S. Appl. No. 12/854,818.
USPTO; Office Action dated Dec. 6, 2012 in U.S. Appl. No. 12/854,818.
USPTO; Final Office Action dated Mar. 13, 2013 in U.S. Appl. No. 12/854,818.
USPTO; Office Action dated Aug. 30, 2013 in U.S. Appl. No. 12/854,818.
USPTO; Final Office Action dated Mar. 26, 2014 in U.S. Appl. No. 12/854,818.
USPTO; Restriction Requirement dated May 8, 2013 in U.S. Appl. No. 13/102,980.
USPTO; Office Action dated Oct. 7, 2013 in U.S. Appl. No. 13/102,980.
USPTO; Final Office Action dated Mar. 25, 2014 in U.S. Appl. No. 13/102,980.
USPTO; Restriction Requirement dated Dec. 16, 2013 in U.S. Appl. No. 13/284,642.
USPTO; Office Action dated Jan. 28, 2014 in U.S. Appl. No. 13/312,591.
USPTO; Office Action dated Jan. 10, 2013 in U.S. Appl. No. 13/339,609.
USPTO; Office Action dated Feb. 11, 2013 in U.S. Appl. No. 13/339,609.
USPTO; Final Office Action dated May 17, 2013 in U.S. Appl. No. 13/339,609.
USPTO; Office Action dated Aug. 29, 2013 in U.S. Appl. No. 13/339,609.
USPTO; Final Office Action dated Dec. 18, 2013 in U.S. Appl. No. 13/339,609.
USPTO; Notice of Allowance dated Apr. 7, 2014 in U.S. Appl. No. 13/339,609.
USPTO; Office Action dated Feb. 13, 2014 in U.S. Appl. No. 13/411,271.
USPTO; Restriction Requirement dated Oct. 29, 2013 in U.S. Appl. No. 13/439,258.
USPTO; Office Action dated Mar. 24, 2014 in U.S. Appl. No. 13/439,258.
USPTO; Office Action dated May 23, 2013 in U.S. Appl. No. 13/465,340.
USPTO; Final Office Action dated Oct. 30, 2013 in U.S. Appl. No. 13/465,340.
USPTO; Notice of Allowance dated Feb. 12, 2014 in U.S. Appl. No. 13/465,340.
USPTO; Office Action dated Dec. 20, 2013 in U.S. Appl. No. 13/535,214.
USPTO; Office Action dated Nov. 15, 2013 in U.S. Appl. No. 13/612,538.
USPTO; Office Action dated Apr. 24, 2014 in U.S. Appl. No. 13/784,362.
Chinese Patent Office; Office Action dated May 24, 2013 in Serial No. 201080036764.6.
Japanese Patent Office; Office Action dated Dec. 25, 2014 in Serial No. 2012-504786.
USPTO; Final Office Action dated Jul. 14, 2014 in U.S. Appl. No. 12/754,223.
USPTO; Office Action dated Jun. 3, 2014 in U.S. Appl. No. 12/854,818.
USPTO; Notice of Allowance dated Jul. 3, 2014 in U.S. Appl. No. 13/102,980.
USPTO; Non-Final Office Action dated Jul. 2, 2014 in U.S. Appl. No. 13/283,408.
USPTO; Restriction Requirement dated Apr. 21, 2014 in U.S. Appl. No. 13/284,642.
USPTO; Final Office Action dated May 14, 2014 in U.S. Appl. No. 13/312,591.
USPTO; Office Action dated Jul. 31, 2014 in U.S. Appl. No. 13/411,271.
USPTO Final Office Action dated Jul. 8, 2014 in U.S. Appl. No. 13/439,528.
USPTO; Final Office Action dated Jun. 18, 2014 in U.S. Appl. No. 13/535,214.
USPTO; Office Action dated Jul. 10, 2014 in U.S. Appl. No. 13/612,538.
USPTO; Office Action dated Jun. 2, 2014 in U.S. Appl. No. 13/677,151.
USPTO; Notice of Allowance dated Aug. 13, 2014 in U.S. Appl. No. 13/784,362.

(56) References Cited

OTHER PUBLICATIONS

USPTO; Restriction Requirement dated Jun. 26, 2014 in U.S. Appl. No. 13/874,708.
USPTO; Office Action dated May 29, 2014 in U.S. Appl. No. 14/183,187.
Chinese Patent Office; Notice on the Third Office Action dated Jul. 1, 2014 in Application No. 201080036764.6.
Taiwan Patent Office; Office Action dated Jul. 4, 2014 in Application No. 099110511.
USPTO; Non-Final Office Action dated Jul. 30, 2014 in U.S. Appl. No. 13/284,642.
USPTO; Non-Final Office Action dated Aug. 8, 2014 in U.S. Appl. No. 13/563,066.
USPTO; Office Action dated Oct. 8, 2014 in U.S. Appl. No. 12/763,037.
USPTO; Non-Final Office Action dated Sep. 17, 2014 in U.S. Appl. No. 13/187,300.
USPTO; Non-Final Office Action dated Nov. 26, 2014 in U.S. Appl. No. 13/312,591.
USPTO; Notice of Allowance dated Oct. 21, 2014 in U.S. Appl. No. 13/439,528.
USPTO; Notice of Allowance dated Oct. 23, 2014 in U.S. Appl. No. 13/535,214.
USPTO; Non-Final Office Action dated Oct. 15, 2014 in U.S. Appl. No. 13/597,043.
USPTO; Final Office Action dated Nov. 14, 2014 in U.S. Appl. No. 13/677,151.
USPTO; Non-Final Office Action dated Oct. 9, 2014 in U.S. Appl. No. 13/874,708.
USPTO; Non-Final Office Action dated Sep. 19, 2014 in U.S. Appl. No. 13/791,246.
USPTO; Non-Final Office Action dated Sep. 12, 2014 in U.S. Appl. No. 13/941,134.
USPTO; Restriction Requirement dated Sep. 16, 2014 in U.S. Appl. No. 13/948,055.
USPTO; Non-Final Office Action dated Oct. 30, 2014 in U.S. Appl. No. 13/948,055.
USPTO; Final Office Action dated Nov. 7, 2014 in U.S. Appl. No. 14/183,187.
Chinese Patent Office; Notice on the Second Office Action dated Sep. 16, 2014 in Application No. 201110155056.
Koutsokeras et al. Texture and Microstructure Evolution in Single-Phase $Ti_xTa_{1-x}N$ Alloys of Rocksalt Structure. Journal of Applied Physics, 110, pp. 043535-1-043535-6, (2011).

* cited by examiner

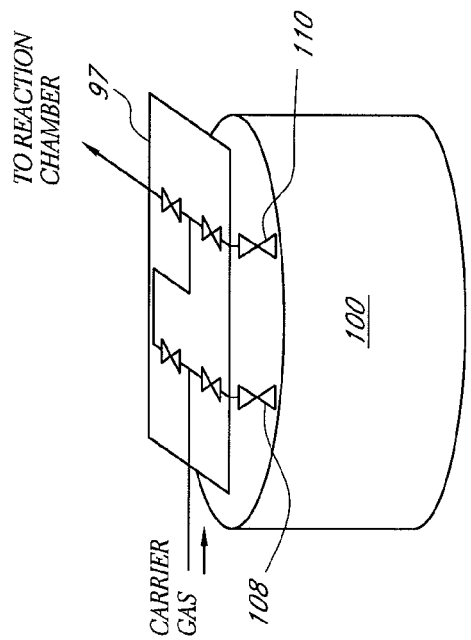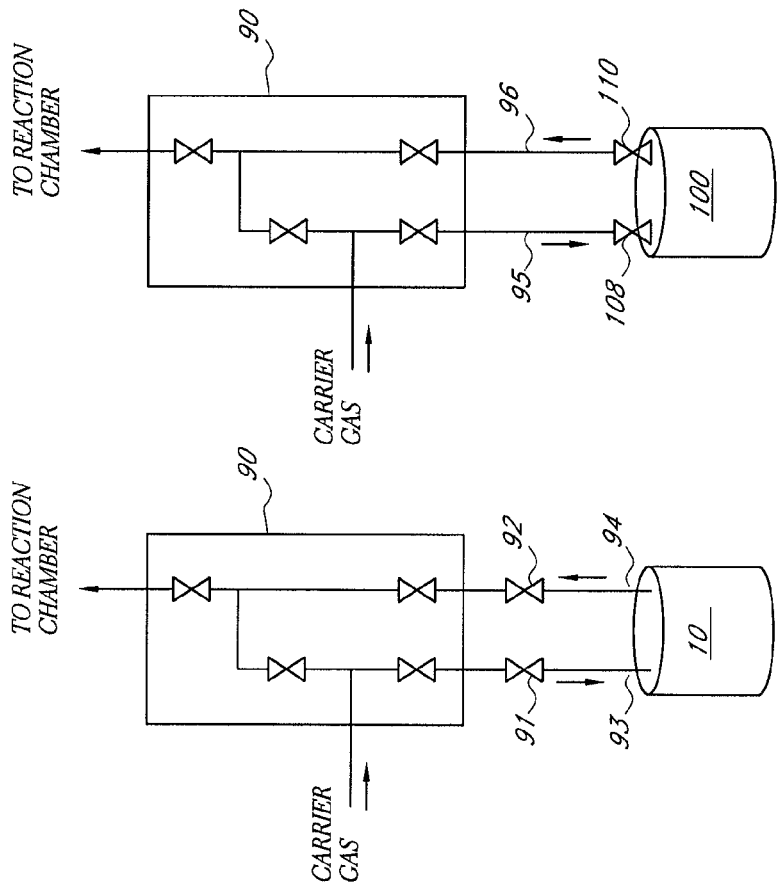
FIG. 6
FIG. 5
FIG. 4
(PRIOR ART)

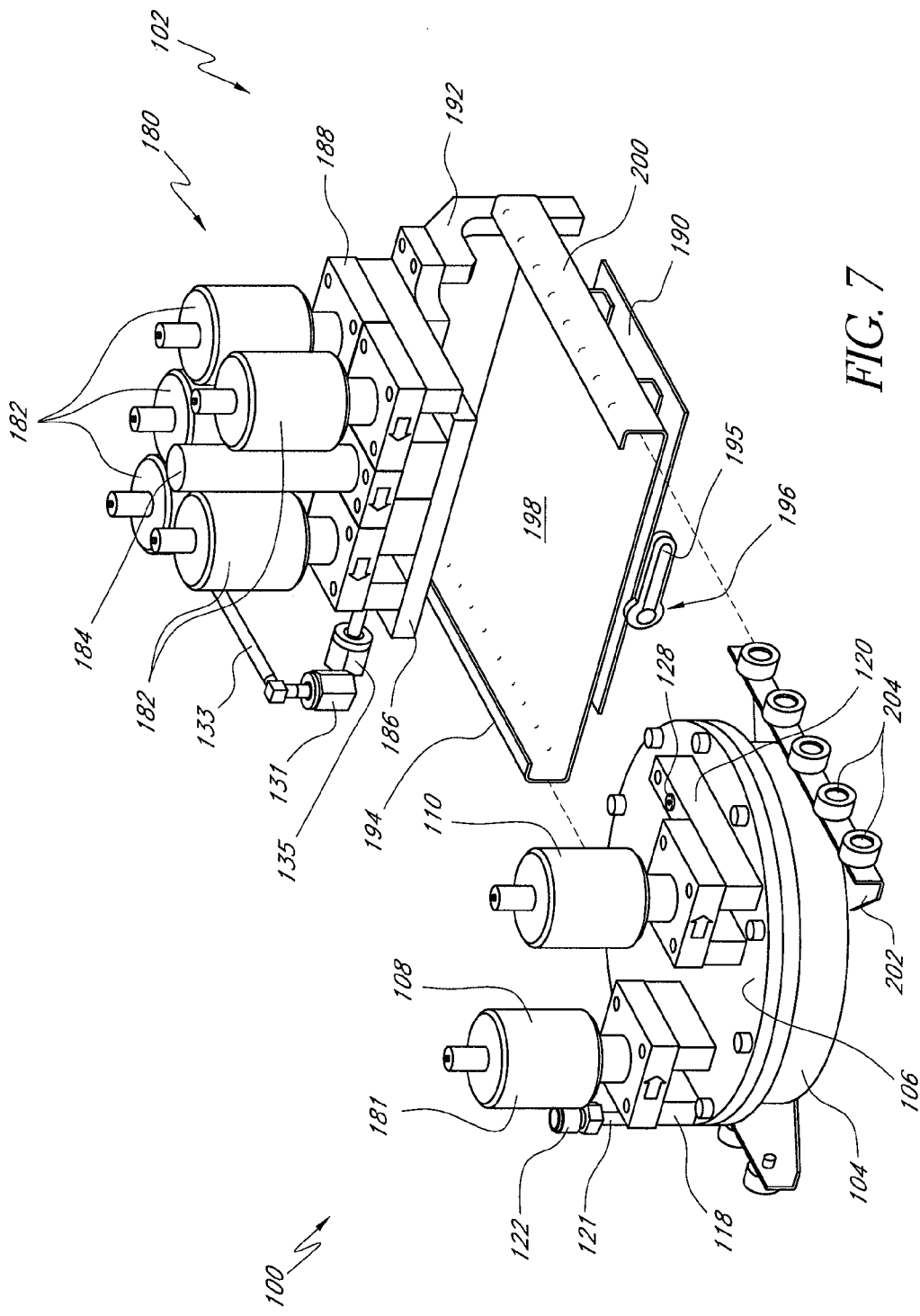

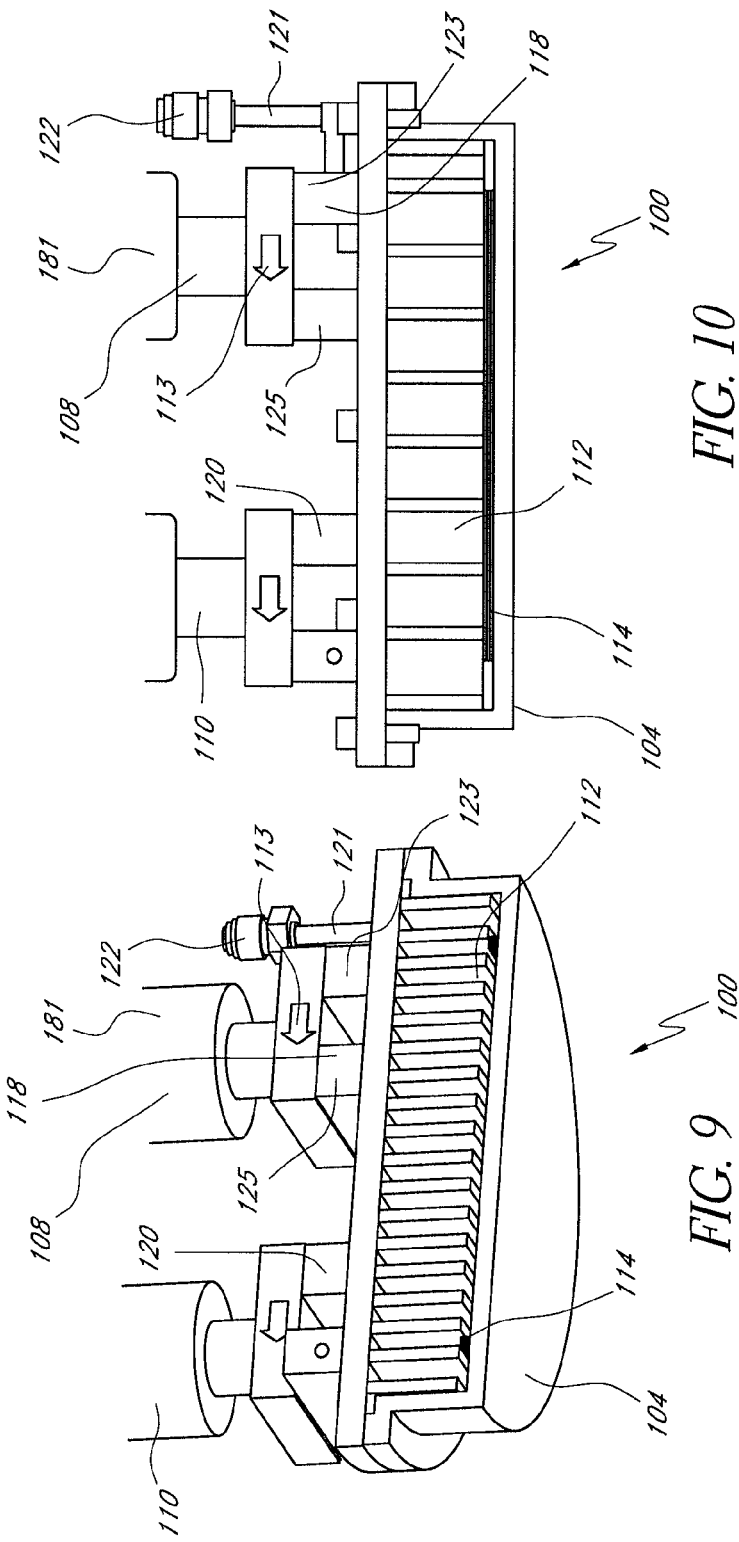

PRECURSOR DELIVERY SYSTEM

CROSS-REFERENCE TO RELATED APPLICATIONS

The present application claims priority to U.S. Provisional Patent Application No. 60/850,886, filed Oct. 10, 2006 and claims priority to and is a continuation-in-part of application Ser. No. 11/870,374, filed Oct. 10, 2007 now U.S. Pat. No. 8,137,462.

FIELD OF THE INVENTION

The present application relates generally to semiconductor processing equipment and specifically to apparatus for delivering reactant gases to processing chambers.

BACKGROUND OF THE INVENTION

Chemical vapor deposition (CVD) is a known process in the semiconductor industry for forming thin films of materials on substrates such as silicon wafers. In CVD, reactant gases (also referred to herein as "precursor gases") of different reactants are delivered to one or more substrates in a reaction chamber. In many cases, the reaction chamber includes only a single substrate supported on a substrate holder (such as a susceptor), with the substrate and substrate holder being maintained at a desired process temperature. The reactant gases react with one another to form thin films on the substrate, with the growth rate being controlled either by the temperature or the amounts of reactant gases.

In some applications, the reactant gases are stored in gaseous form in a reactant source vessel. In such applications, the reactant vapors are often gaseous at ambient (i.e., normal) pressures and temperatures. Examples of such gases include nitrogen, oxygen, hydrogen, and ammonia. However, in some cases, the vapors of source chemicals ("precursors") that are liquid or solid (e.g., hafnium chloride) at ambient pressure and temperature are used. These source chemicals may have to be heated to produce sufficient amounts of vapor for the reaction process. For some solid substances (referred to herein as "solid source precursors"), the vapor pressure at room temperature is so low that they have to be heated to produce a sufficient amount of reactant vapor and/or maintained at very low pressures. Once vaporized, it is important that the vapor phase reactant is kept at or above the vaporizing temperature through the processing system so as to prevent undesirable condensation in the valves, filters, conduits, and other components associated with delivering the vapor phase reactants to the reaction chamber. Vapor phase reactants from such naturally solid or liquid substances are useful for chemical reactions in a variety of other industries.

Atomic layer deposition (ALD) is another known process for forming thin films on substrates. In many applications, ALD uses a solid and/or liquid source chemical as described above. ALD is a type of vapor deposition wherein a film is built up through self-saturating reactions performed in cycles. The thickness of the film is determined by the number of cycles performed. In an ALD process, gaseous precursors are supplied, alternatingly and repeatedly, to the substrate or wafer to form a thin film of material on the wafer. One reactant adsorbs in a self-limiting process on the wafer. A different, subsequently pulsed reactant reacts with the adsorbed material to form a single molecular layer of the desired material. Decomposition may occur through reaction with an appropriately selected reagent, such as in a ligand exchange or a gettering reaction. In a typical ALD reaction, no more than a molecular monolayer forms per cycle. Thicker films are produced through repeated growth cycles until the target thickness is achieved.

A typical solid or liquid source precursor delivery system includes a solid or liquid source precursor vessel and a heating means (e.g., radiant heat lamps, resistive heaters, etc.). The vessel includes the solid (e.g., in powder form) or liquid source precursor. The heating means heats up the vessel to increase the vapor pressure of precursor gas in the vessel. The vessel has an inlet and an outlet for the flow of an inert carrier gas (e.g., $N_2$) through the vessel. The carrier gas sweeps precursor vapor along with it through the vessel outlet and ultimately to a substrate reaction chamber. The vessel typically includes isolation valves for fluidly isolating the contents of the vessel from the vessel exterior. Ordinarily, one isolation valve is provided upstream of the vessel inlet, and another isolation valve is provided downstream of the vessel outlet. Precursor source vessels are normally supplied with tubes extending from the inlet and outlet, isolation valves on the tubes, and fittings on the valves, the fittings being configured to connect to the gas flow lines of the remaining substrate processing apparatus. It is often desirable to provide a number of additional heaters for heating the various valves and gas flow lines between the precursor source vessel and the reaction chamber, to prevent the precursor gas from condensing and depositing on such components. Accordingly, the gas-conveying components between the source vessel and the reaction chamber are sometimes referred to as a "hot zone" in which the temperature is maintained above the vaporization/condensation temperature of the precursor.

It is known to provide a serpentine or tortuous flow path for the flow of carrier gas while it is exposed to a solid or liquid precursor source. For example, U.S. Pat. Nos. 4,883,362; 7,122,085; and 7,156,380 each disclose such a serpentine path.

BRIEF SUMMARY OF THE INVENTION

In an aspect of the present invention, a precursor source vessel is provided. The precursor source vessel includes a lid having an inlet port, an outlet port, and a burp port. The precursor source vessel further includes a base removably attached to the lid. The base includes a recessed region formed therein.

In another aspect of the present invention, a precursor source vessel is provided. The precursor source vessel includes a base having a recessed region formed therein. The recessed region is configured to receive a precursor material. The precursor source vessel also includes a lid removably attached to the base. The lid has an inlet port, an outlet port, and a burp port. A burp valve is operatively attached to the lid. The burp valve is operatively connected to the burp port.

In yet another aspect of the present invention, a precursor source vessel is provided. The precursor source vessel includes a base having a bottom surface, a contact surface, a side surface extending between the contact and bottom surfaces, and an inner surface extending from the contact surface to define a recessed region within the base. The precursor source vessel also includes a lid removably attached to the base. The lid includes an inlet port, an outlet port, and a burp port.

In still another aspect of the present invention, a precursor source vessel is provided. The precursor source vessel includes a lid having a first port, a second port, and a third port. The precursor source vessel also includes a base removably attached to the lid. The base includes a recessed region formed therein.

In still another aspect, an apparatus for connecting a chemical reactant source vessel to a gas interface assembly of a vapor phase reactor for vapor processing of substrates is provided. The apparatus comprises a vessel, a gas interface assembly of a vapor phase reactor, and a connection assembly for connecting the vessel to the gas interface assembly. The vessel has a chamber adapted to contain a solid or liquid chemical reactant. The vessel includes an inlet and an outlet in fluid communication with the chamber. The gas interface assembly has a gas inlet adapted to connect to the outlet of the vessel chamber. The connection assembly comprises a track component and a lift assembly. The track component includes one or more elongated tracks adapted to movably engage one or more track engagement members of the vessel. The lift assembly is configured to move the track component vertically between a lowered position and a raised position. When the vessel's one or more track engagement members engage the one or more tracks of the track component, and when the lift assembly moves the track component to its raised position, the vessel's outlet becomes positioned to substantially directly fluidly communicate with the gas inlet of the gas interface assembly.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

All of these embodiments are intended to be within the scope of the invention herein disclosed. These and other embodiments of the present invention will become readily apparent to those skilled in the art from the following detailed description of the preferred embodiments having reference to the attached figures, the invention not being limited to any particular preferred embodiment(s) disclosed.

BRIEF DESCRIPTION OF SEVERAL VIEWS OF THE DRAWINGS

These and other aspects of the invention will be readily apparent to the skilled artisan in view of the description below, the appended claims, and from the drawings, which are intended to illustrate and not to limit the invention, and wherein:

FIG. 4 is a schematic illustration of a conventional precursor source vessel and gas panel.

FIG. 5 is a schematic illustration of a precursor source vessel with surface-mounted valves and a gas panel.

FIG. 6 is a schematic illustration of a precursor source vessel with surface-mounted valves and a gas panel in close thermal contact with the vessel.

FIG. 7 is a perspective view of an embodiment of a precursor source vessel, a gas interface assembly for fluidly communicating with the vessel, and a quick-connection assembly for connecting and disconnecting the vessel to the gas interface assembly.

FIG. 9 is a rear perspective sectional view of the vessel of FIG. 7.

FIG. 10 is a rear sectional view of the vessel of FIG. 7.

DETAILED DESCRIPTION OF THE PREFERRED EMBODIMENT

The present application for letters patent discloses improved precursor source vessels, apparatuses and methods for loading and connecting the vessels to a reactor, and interfaces for using the vessels with vapor processing reactors. The disclosed embodiments provide excellent access to reactant vapor, reduced contamination of the reactor's gas delivery system, and improved serviceability (e.g., replacement or recharging) of the precursor source vessel.

The following detailed description of the preferred embodiments and methods details certain specific embodiments to assist in understanding the claims. However, one may practice the present invention in a multitude of different embodiments and methods, as defined and covered by the claims.

Gas Delivery System Overview

Figure 1:
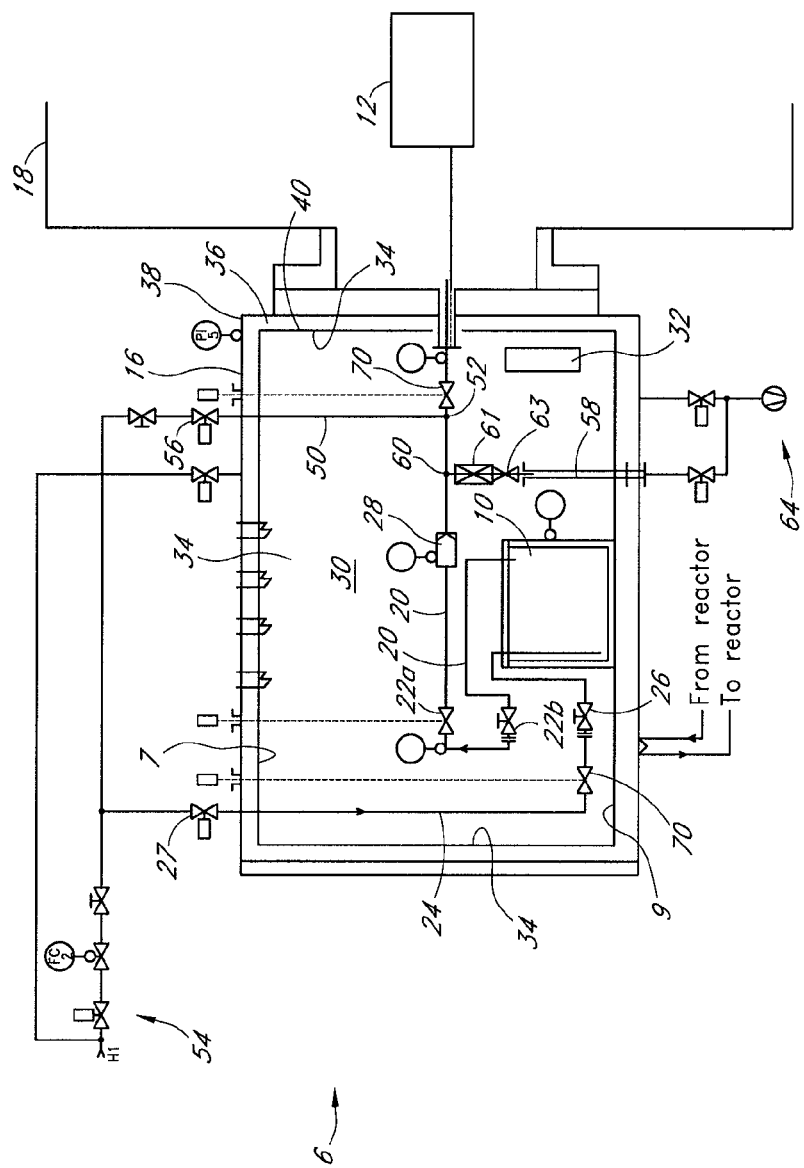
FIG. 1 is a schematic illustration of a conventional precursor source assembly and a reactor chamber assembly.

FIG. 1 schematically illustrates a conventional precursor delivery system 6 for feeding a gas phase reactant generated from a solid or liquid precursor source vessel 10 into a gas phase reaction chamber 12. Skilled artisans will understand that the precursor delivery systems of the present invention may incorporate many of the aspects of the gas delivery system 6 of FIG. 1. Accordingly, the conventional delivery system 6 is now described in order to better understand the invention.

With reference to FIG. 1, the solid or liquid source vessel 10 contains a solid or liquid source precursor (not shown). A solid source precursor is a source chemical that is solid under standard conditions (i.e., room temperature and atmospheric pressure). Similarly, a liquid source precursor is a source chemical that is liquid under standard conditions. The precursor is vaporized within the source vessel 10, which may be maintained at or above a vaporizing temperature. The vaporized reactant is then fed into the reaction chamber 12. The reactant source vessel 10 and the reaction chamber 12 can be located in a reactant source cabinet 16 and a reaction chamber vessel 18, respectively, which are preferably individually evacuated and/or thermally controlled. This can be achieved by providing these components with separate cooling and heating devices, insulation, and/or isolation valves and associated piping, as known in the art.

The illustrated gas delivery system 6 is particularly suited for delivering vapor phase reactants to be used in a vapor phase reaction chamber. The vapor phase reactants can be used for deposition (e.g., CVD) or Atomic Layer Deposition (ALD).

As seen in FIG. 1, the reactant source vessel 10 and the reaction chamber 12 are adapted to be in selective fluid communication with each other through a first conduit 20 so as to feed the gas phase reactant from the reactant source vessel 10 to the reaction chamber 12 (such as an ALD reaction chamber). The first conduit 20 includes one or more isolation valves 22a, 22b, which may be used for separating the gas spaces of the reactant source vessel 10 and the reaction chamber 12 during evacuation and/or maintenance of either or both of the reactant source vessel 10 and the reaction chamber vessel 18.

Inactive or inert gas is preferably used as a carrier gas for the vaporized precursor. The inert gas (e.g., nitrogen or argon) may be fed into the precursor source vessel 10 through a second conduit 24. The reactant source vessel 10 includes at least one inlet for connection to the second conduit 24 and at least one outlet for withdrawing gas from the vessel 10. The outlet of the vessel 10 is connected to the first conduit 20. The vessel 10 can be operated at a pressure in excess of the pressure of the reaction chamber 12. Accordingly, the second conduit 24 includes at least one isolation valve 26, which can be used for fluidly isolating the interior of the vessel 10 during maintenance or replacement of the vessel. A control valve 27 is preferably positioned in the second conduit 24 outside of the reactant source cabinet 16.

In another variation (which can be employed in embodiments of the present invention), the precursor vapor can be drawn to the reaction chamber 12 by applying a vacuum to the reactant source vessel 10, without using a carrier gas. This is sometimes referred to as "vapor draw."

In yet another variation (which can also be employed in embodiments of the present invention), the precursor vapor can be drawn out of the vessel 10 by an external gas flow that creates a lower pressure outside of the vessel, as in a Venturi effect. For example, the precursor vapor can be drawn by flowing a carrier gas toward the reaction chamber 12 along a path downstream of the vessel 10. Under some conditions, this can create a pressure differential between the vessel 10 and the flow path of the carrier gas. This pressure differential causes the precursor vapor to flow toward the reaction chamber 12.

In order to remove dispersed solid particles when a solid source precursor is used, the gas delivery system 6 includes a purifier 28 through which the vaporized reactant is conducted. The purifier 28 may comprise one or more of a wide variety of purifying devices, such as mechanical filters, ceramic molecular sieves, and electrostatic filters capable of separating dispersed solids or particles or molecules of a minimum molecular size from the reactant gas flow. It is also known to provide an additional purifier in the vessel 10. In particular, U.S. Published Patent Application No. US 2005/0000428A1 discloses a vessel comprising a glass crucible enclosed within a steel container, the crucible containing the reactant source and having a lid with a filter. The lid is separate from a vessel lid that attaches to the steel container.

With continued reference to FIG. 1, the reactant source vessel 10 is positioned within the reactant source cabinet 16. The interior space 30 of the cabinet 16 can be kept at a reduced pressure (e.g., 1 mTorr to 10 Torr, and often about 500 mTorr) to promote radiant heating of the components within the cabinet 16 and to thermally isolate such components from each other to facilitate uniform temperature fields. In other variations, the cabinet is not evacuated and includes convection-enhancing devices (e.g., fans, cross-flows, etc.). The illustrated cabinet 16 includes one or more heating devices 32, such as radiation heaters. Also, reflector sheets 34 can be provided, which may be configured to surround the components within the cabinet 16 to reflect the radiant heat generated by the heating devices 32 to the components positioned within the cabinet 16. Reflector sheets 34 can be provided on the inner walls 40 of the cabinet 16, as well as on the cabinet's ceiling 7 and floor 9. In the illustrated apparatus, a substantial length of the first conduit 20 is contained within the reactant source cabinet 16. Thus the first conduit 20 will inherently receive some heat to prevent condensation of reactant vapors.

The reactant source cabinet 16 can include a cooling jacket 36 formed between an outer wall 38 and an inner wall 40 of the cabinet. The cooling jacket 36 can contain water or another coolant. The jacket 36 allows the outer surface 38 of the cabinet 16 to be maintained at or near ambient temperatures.

In order to prevent or reduce gas flow from the reactant source vessel 10 between the alternating pulses of an ALD process, it is possible to form an inactive gas barrier in the first conduit 20. This is also sometimes referred to as "inert gas valving" or a "diffusion barrier" in a portion of the first conduit 20 to prevent flow of reactant from the reactant source vessel 10 to the reaction chamber 12 by forming a gas phase barrier by flowing gas in the opposite direction to the normal reactant flow in the first conduit 20. The gas barrier can be formed by feeding inactive gas into the first conduit 20 via a third conduit 50 connected to the conduit 20 at a connection point 52. The third conduit 50 can be connected to an inert gas source 54 that supplies the second conduit 24. During the time intervals between the feeding of vapor-phase pulses from the reactant source vessel 10, inactive gas is preferably fed into the first conduit 20 through the third conduit 50. This gas can be withdrawn via a fourth conduit 58, which is connected to the first conduit 20 at a second connection point 60 located upstream of the first connection point 52 (i.e., closer to the reactant source vessel 10). In this manner, an inert gas flow of an opposite direction to the normal reactant gas flow is achieved (between reactant pulses) in the first conduit 20 between the first and second connection points 52, 60. The fourth conduit 58 can be in communication with an evacuation source 64 (such as a vacuum pump). A restriction 61 and valves 56, 63, and 70 can also be provided. Further details of the gas delivery system 6 are illustrated and described in U.S. Published Patent Application No. US 2005/0000428A1.

Existing solid or liquid precursor source delivery systems, such as the system 6 shown in FIG. 1, have a number of drawbacks and limitations. One drawback is that it is sometimes necessary to provide a large number of additional heaters to heat up the gas lines and valves between the precursor source vessel (such as the vessel 10) and the reaction chamber (such as the reaction chamber 12). In particular, it is normally desirable to maintain all of these intervening gas-conveying components (e.g., the valves 22a, 22b, 70, purifier 28, conduit 20) at a temperature above the condensation temperature of the precursor, to prevent the precursor vapor from depositing on such components. Typically, these intervening components are heated separately by line heaters, cartridge heaters, heat lamps, and the like. Some systems (e.g., U.S. Published Patent Application No. 2005/0000428A1) utilize these additional heaters to bias the intervening components to a temperature above that of the source vessel. Such temperature biasing helps to prevent precursor condensation in the intervening components during cool-down. Since the source vessel typically has a higher thermal mass than the intervening gas-conveying components, these components are at risk of cooling down to the condensation temperature faster than the source vessel. This can lead to an undesirable condition in which the source vessel is still producing precursor vapor that can flow to the cooler intervening components and deposit thereon. The temperature biasing can overcome this problem. However, the need for additional heaters increases the total size and operating cost of the apparatus.

Further, conventional solid source delivery systems typically employ filters (such as the purifier 28 of FIG. 1) between the source vessel outlet and the substrate reaction chamber, in order to prevent solid precursor particles (e.g., powder entrained in the carrier gas flow) from entering the reaction chamber. Such filters also add to the total size of the apparatus and can require additional heaters to prevent condensation therein. Also, such filters are typically downstream of the source vessel outlet, which involves a risk that precursor particles may deposit on gas-conveying components downstream of the vessel outlet, such as within gas conduits or within the vessel outlet valve itself. These particles can damage components such as valves, which can compromise their ability to completely seal.

Figure 2:
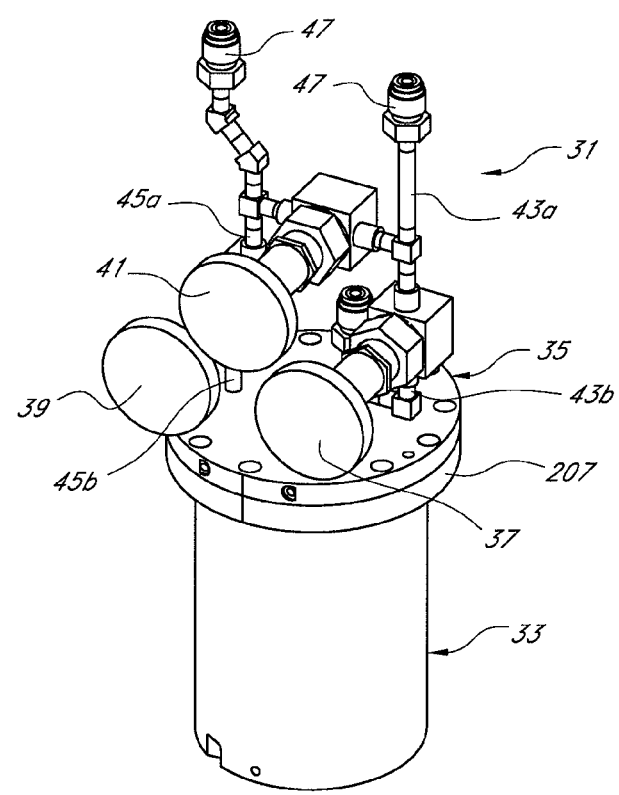
FIG. 2 is a perspective view of a conventional solid precursor source vessel.

Another drawback of conventional solid or liquid source delivery systems is that it is often difficult to recharge or replace the precursor source vessel. FIG. 2 shows a typical precursor source vessel 31 comprising a container body 33 and a lid 35. The lid 35 includes inlet tubes 43a, 43b and outlet tubes 45a, 45b extending upward therefrom. An isolation valve 37 is interposed between the inlet tubes 43a, 43b, and an isolation valve 39 is interposed between the outlet tubes 45a, 45b. Another isolation valve 41 is interposed between gas lines connecting the tubes 43a and 45a. The inlet tubes 43a, 43b and outlet tubes 45a, 45b provide for the flow of an inert carrier gas through the container body 33. The tubes 43a, 45a typically include fittings 47 configured to connect to other gas flow lines of the reactant gas delivery system. When the solid or liquid source precursor is depleted and in need of replacement, it is customary to replace the entire source vessel 31 with a new one that has a full load of the source chemical. Replacing the source vessel 31 requires shutting off the isolation valves 37 and 39, disconnecting the fittings 47 from the remaining substrate processing apparatus, physically removing the vessel 31, placing a new vessel 31 in the appropriate location, and connecting the fittings 47 of the new vessel 31 to the remaining substrate processing apparatus. Often, this process also involves disassembling various thermocouples, line heaters, clamps, and the like. These processes can be somewhat laborious.

Another drawback of conventional solid or liquid source delivery systems is that the gas delivery system can produce areas of stagnant flow (also referred to as "dead legs"). Dead legs tend to occur when the gas flow path from the precursor source vessel is longer and more complex. Conventional inlet and outlet isolation valves for the source vessel (as described above) can produce dead legs. In general, dead legs increase the risk of unwanted precursor deposition on the gas-conveying components of the delivery system. Such unwanted precursor deposition can occur due to cold spots associated with the dead volumes, wherein the precursor solidifies at temperatures below the sublimation/melting temperature. Such unwanted precursor deposition can also occur due to hot spots associated with the dead volumes, wherein the precursor decomposes at high temperatures. For this reason, it is generally desirable to reduce and minimize stagnation of the reactant gas flow. It is also generally desirable to reduce the surface area to be temperature-controlled, in order to lessen the chance of producing hot or cold spots.

Another reason to minimize the amount and volume of dead legs is to reduce the total volume of the gas delivery system interposed between the precursor source vessel and the substrate reaction chamber. As the total volume of the gas delivery system increases, often times the minimum pulse time and minimum purge time associated with ALD processing increase as well. The minimum pulse time is the pulse time necessary for an injected reactant to saturate the surface of a substrate being processed. The minimum purge time is the time necessary to purge excess reactant from the substrate reaction chamber and gas delivery system between reactant pulses. Substrate throughput (the rate at which substrates can be processed) is increased when the minimum pulse time and minimum purge time are decreased. Accordingly, it is desirable to reduce the amount and volume of dead legs in order to increase throughput.

Figure 3:
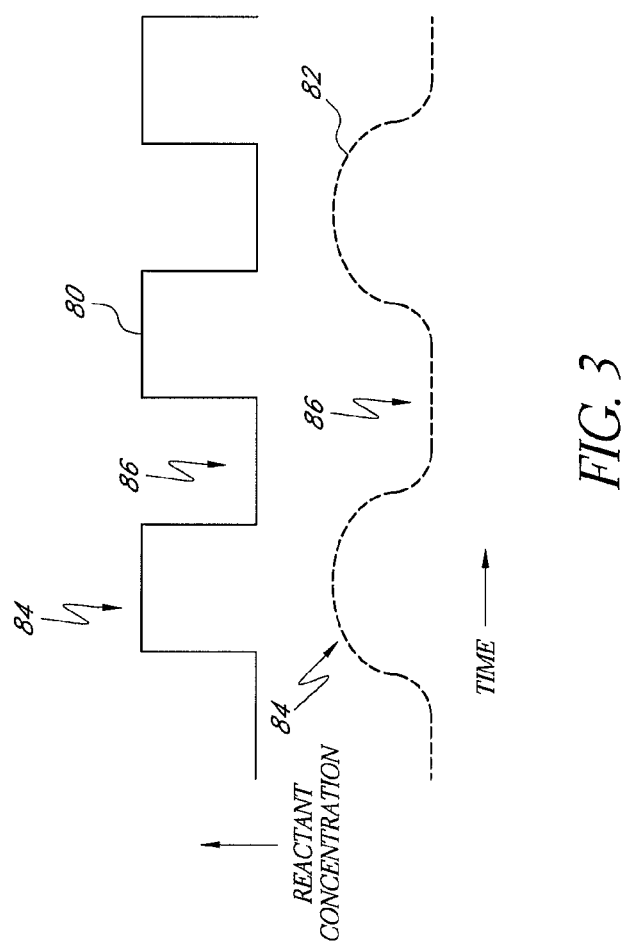
FIG. 3 is an illustration of both ideal and less than ideal source chemical concentrations in reactant gas pulses for atomic layer deposition.

Another benefit of reducing the total volume of the gas delivery system is to improve the "pulse shape" of the reactant gas pulses. The pulse shape refers to the shape of a curve of the reactant's chemical concentration in the reactant/carrier mixture, for a reactant gas pulse. FIG. 3 shows an example of an ideal reactant concentration curve 80, as well as a curve 82 that is less than ideal. Both curves include reactant gas pulses 84 separated by time periods 86 of substantially zero reactant concentration. The ideal curve 80 resembles a rectilinear wave, such as a square wave. A substantially rectilinear wave is preferred because it is highly desirable for each reactant gas pulse to deliver the reactant species to all of the available reaction sites on the substrate surface (saturation) in the least amount of time, in order to optimize substrate throughput. A rectilinear pulse shape, as in the curve 80, optimizes throughput because the duration of each pulse has a high concentration of the reactant, which in turn reduces the pulse duration necessary to deliver sufficient reactant species to the substrate surface. Also, the reduced dispersion of a rectilinear pulse shape reduces the amount of "pulse overlap" between successive pulses of different precursors, which reduces the potential for unwanted CVD growth modes. In contrast, the pulse concentration of each pulse 84 of the non-ideal curve 82 takes longer to reach its maximum level, which increases the pulse duration necessary to fully saturate the substrate surface. Thus, the frequency of the curve 80 is less than that of the curve 82. As the total volume of the gas delivery system increases, the pulse shape deteriorates. Accordingly, it is desirable to improve the pulse shape (i.e., make it more like a square wave) by minimizing dead legs.

Another drawback of conventional solid source delivery systems is the risk of contamination involved in venting the precursor source vessel prior to processing. Precursor source vessels are typically supplied with a head pressure of gas in the vessel. For example, a source vessel filled with precursor powder is often shipped with helium or other inert gas at a pressure slightly higher (e.g., 5 psi) than ambient pressure. Helium is typically used to enable an "out-bound" helium leak test using a helium leak detector to ensure vessel integrity just prior to shipment. This helium is often left or replaced with $N_2$ or other inert gas so that if a small leak is present, the gas leaks outward from the vessel, preventing atmospheric contamination of the precursor within the vessel. Before the vessel is used in substrate processing, the head pressure of internal gas is ordinarily removed. Typically, the vessel's internal gas is vented out through the vessel's outlet isolation valve, through the reactant gas delivery system, and ultimately through the reactor's exhaust/scrubber. In some systems, the vessel's internal gas is vented out through the substrate reaction chamber. Other systems employ a gas line in parallel with the reaction chamber (i.e., extending from a point just upstream of the reaction chamber to a point just downstream of the reaction chamber), such that the vessel's internal gas can be directed to the exhaust/scrubber without flowing through the reaction chamber. In either case, current vessel designs involve a risk of particle generation when the vessel is relieved of the head pressure. This can result in precursor powder becoming entrained within the vent flow (i.e., the venting out of the internal pressurized gas of the vessel), which can contaminate and possibly damage downstream components of the gas delivery system, including the vessel outlet itself. Even during normal processing, precursor material (e.g., powder) can become entrained within the carrier gas flowing through the precursor source vessel, which involves a risk of unwanted deposition of the precursor within the gas delivery system.

The presently disclosed embodiments of precursor delivery systems substantially overcome these problems by employing an improved precursor source vessel and apparatus for quickly connecting and disconnecting the vessel from the rest of the delivery system. These aspects are now described.

Gas Panel in Close Thermal Contact with Source Vessel

FIGS. 4-6 illustrate three different gas panel arrangements. A gas panel typically includes one or more valves that are downstream of a precursor source vessel, and can also include one or more valves upstream of the vessel. FIG. 4 illustrates a conventional arrangement in which a source chemical is contained within a source vessel 10. A gas panel 90 includes a plurality of valves operable to deliver carrier gas from a carrier gas source (not shown) through the vessel 10 and into a reaction chamber (not shown). An inlet valve 91 is connected upstream of the vessel 10 by tubing 93, and an outlet valve 92 is connected downstream of the vessel 10 by tubing 94. In this conventional arrangement, the inlet valve 91, the outlet valve 92, and the valves and tubing of the gas panel 90 are typically not in close thermal contact with the vessel 10.

FIG. 5 illustrates an arrangement that is somewhat improved relative to that of FIG. 4. In the arrangement of FIG. 5, a precursor source vessel 100 has a surface-mounted inlet valve 108 and a surface-mounted outlet valve 110. The valves 108 and 110 are separated from a conventional gas panel 90 by tubing 95 and 96. In this arrangement, the valves 108 and 110 are in close thermal contact with the vessel 100, but the valves and tubing of the gas panel 90 are not.

FIG. 6 illustrates an arrangement that is improved relative to that of FIG. 5. In the arrangement of FIG. 6, the source vessel 100 has a generally flat upper surface with a surface-mounted inlet valve 108 and a surface-mounted outlet valve 110. Also, a gas panel 97 is arranged such that the valves and tubing of the gas panel are positioned along a plane that is generally parallel to the generally flat surface of the vessel 100. In order to increase thermal contact between the vessel 100 and the gas panel valves and tubing, the distance between the plane of the gas panel valves and tubing and the generally flat surface of the vessel 100 is preferably no more than about 10.0 cm, more preferably no more than about 7.5 cm, and even more preferably no more than about 5.3 cm.

Source Vessel with Surface Mounted Valves and Serpentine Pathway

FIG. 7 shows an embodiment of an improved solid or liquid precursor source vessel 100 and a quick-connection assembly 102. The source vessel 100 includes a container body 104 and a lid 106. The lid 106 includes surface-mounted isolation valves 108 and 110, described in more detail below.

Figure 8:
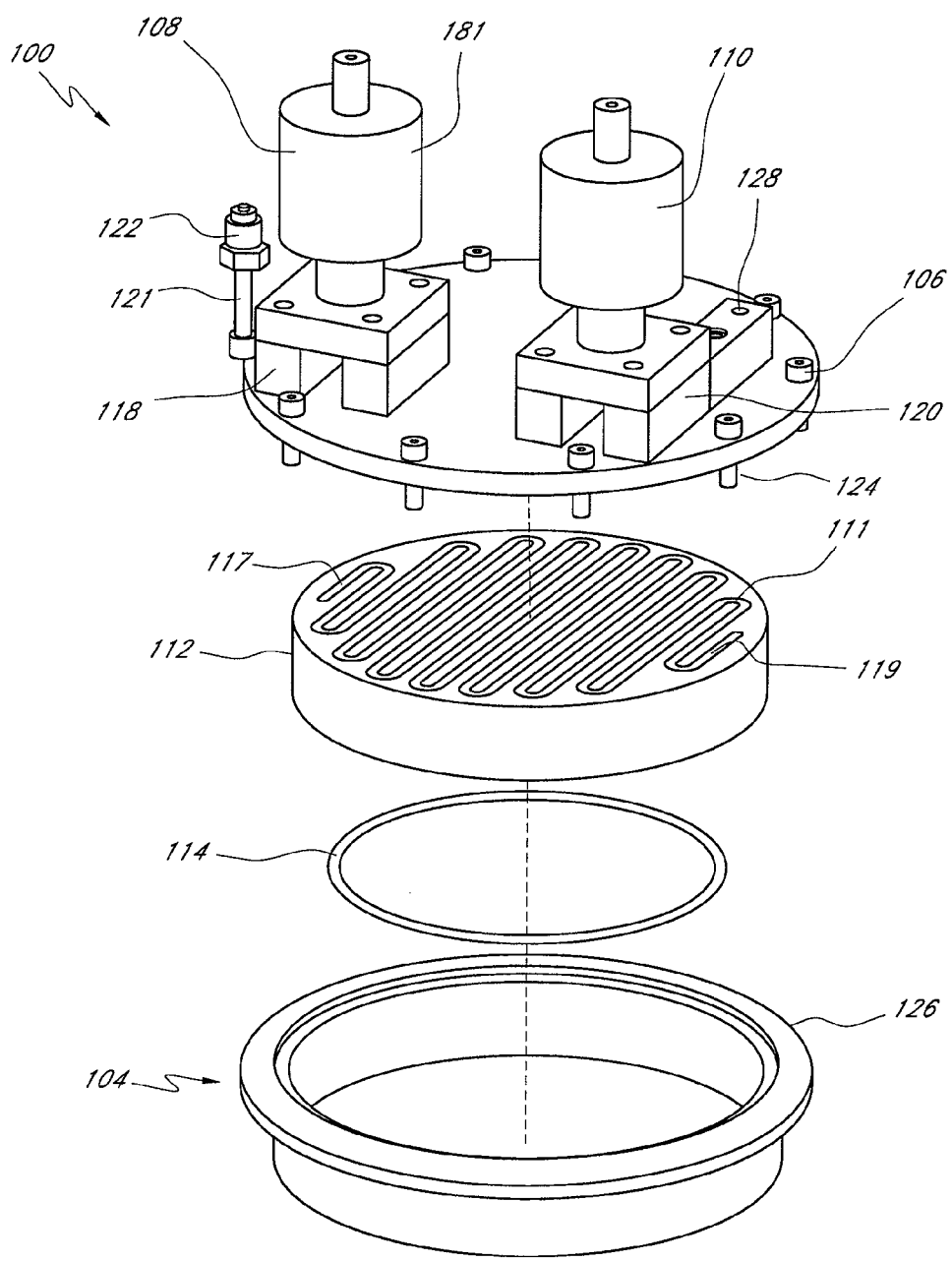
FIG. 8 is an exploded perspective view of the vessel of FIG. 7.

FIGS. 8-10 show the source vessel 100 of FIG. 7 in greater detail. FIG. 8 is an exploded view, and FIGS. 9 and 10 are rear cross-sectional views, of the source vessel 100. The illustrated vessel 100 includes the container body 104, a serpentine pathway insert 112 within the body 104, and the lid component 106. The illustrated assembly is fastened together by fastening elements 124, such as screws or nut and bolt combinations. The fastening elements 124 are adapted to extend into aligned holes within a flange 126 of the body 104. Skilled artisans will appreciate that the assembly can be fastened together by a variety of alternative methods.

The serpentine pathway insert 112 preferably defines a tortuous or serpentine pathway 111 through which a carrier gas must travel as it flows through the vessel 100. The serpentine pathway 112 preferably contains the precursor source, such as a powder or liquid. The serpentine pathway 111 is significantly longer than the carrier gas flow pathway within conventional precursor source vessels. The valves 108 and 110 (described below) and the valve 210 (described below with reference to FIGS. 26-28) are subjected to a less severe environment, thereby increasing their reliability.

A spring 114 is preferably provided to bias the serpentine insert 112 against the lid 106, to prevent the escape of reactant gas through the interface between the insert 112 and the lid 106. In other words, the spring 114 tends to reduce the risk of the gas bypassing some or all of the serpentine path. Suitable springs 114 include flat wire compression springs, such as the Spirawave® wave springs sold by Smalley Steel Ring Company of Lake Zurich, Ill.

Figure 11A:
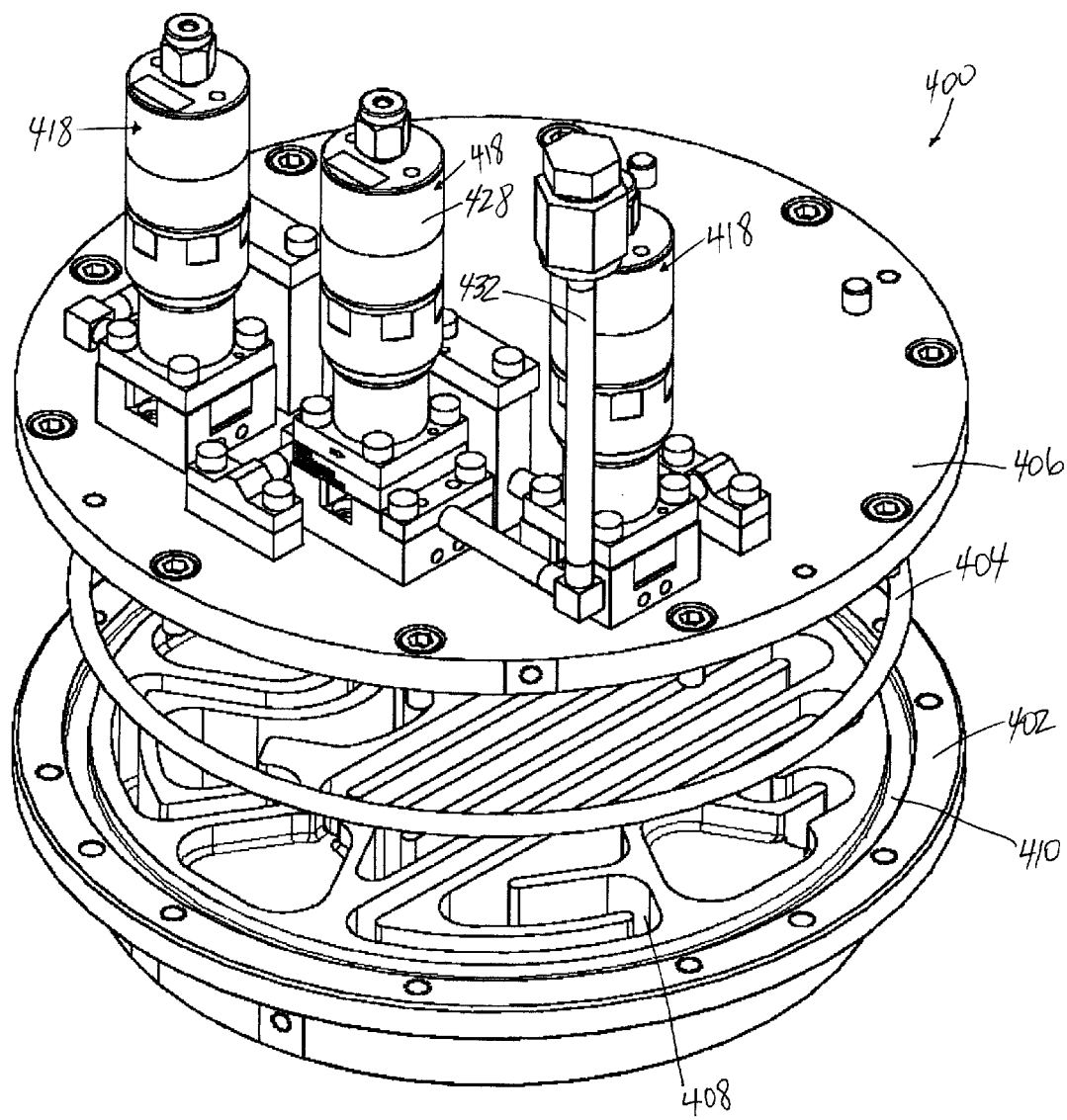
FIG. 11A is an exploded view of another embodiment of a precursor source vessel.
Figure 11B:
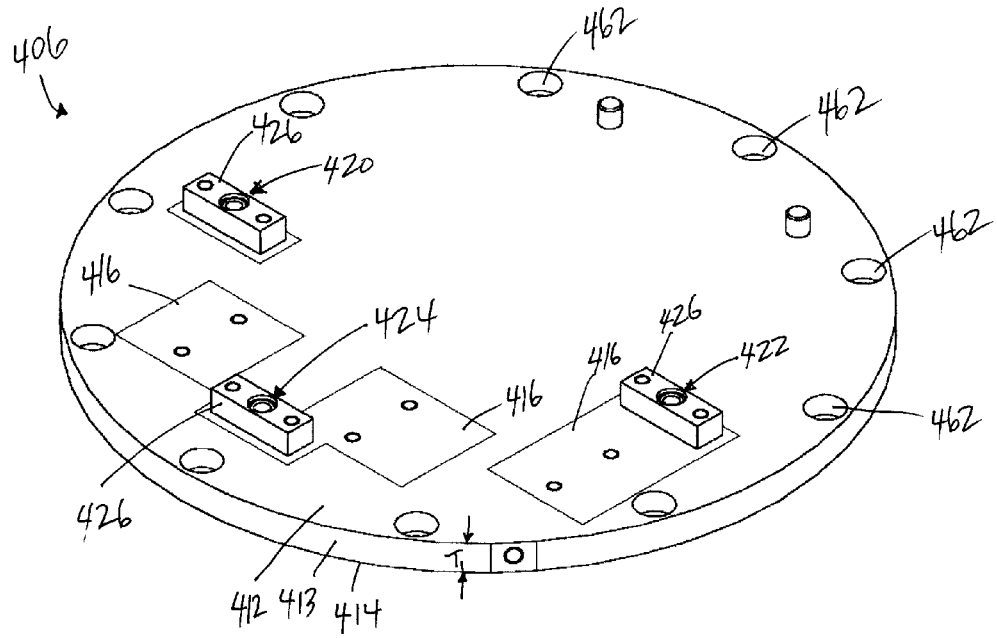
FIG. 11B is a top perspective view of a lid for the precursor source vessel shown in FIG. 11A.
Figure 11C:
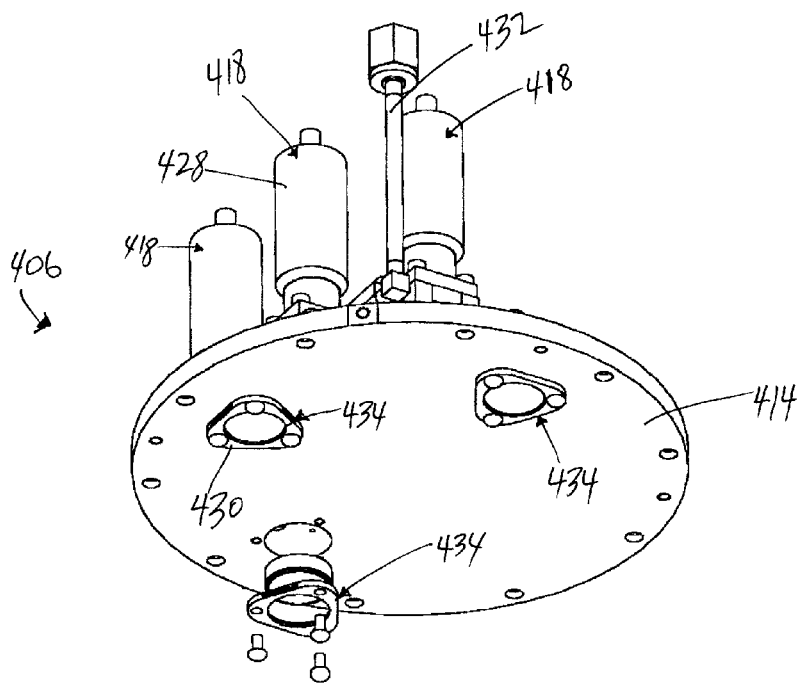
FIG. 11C is a bottom perspective view of the lid shown in FIG. 11B.
Figure 11D:
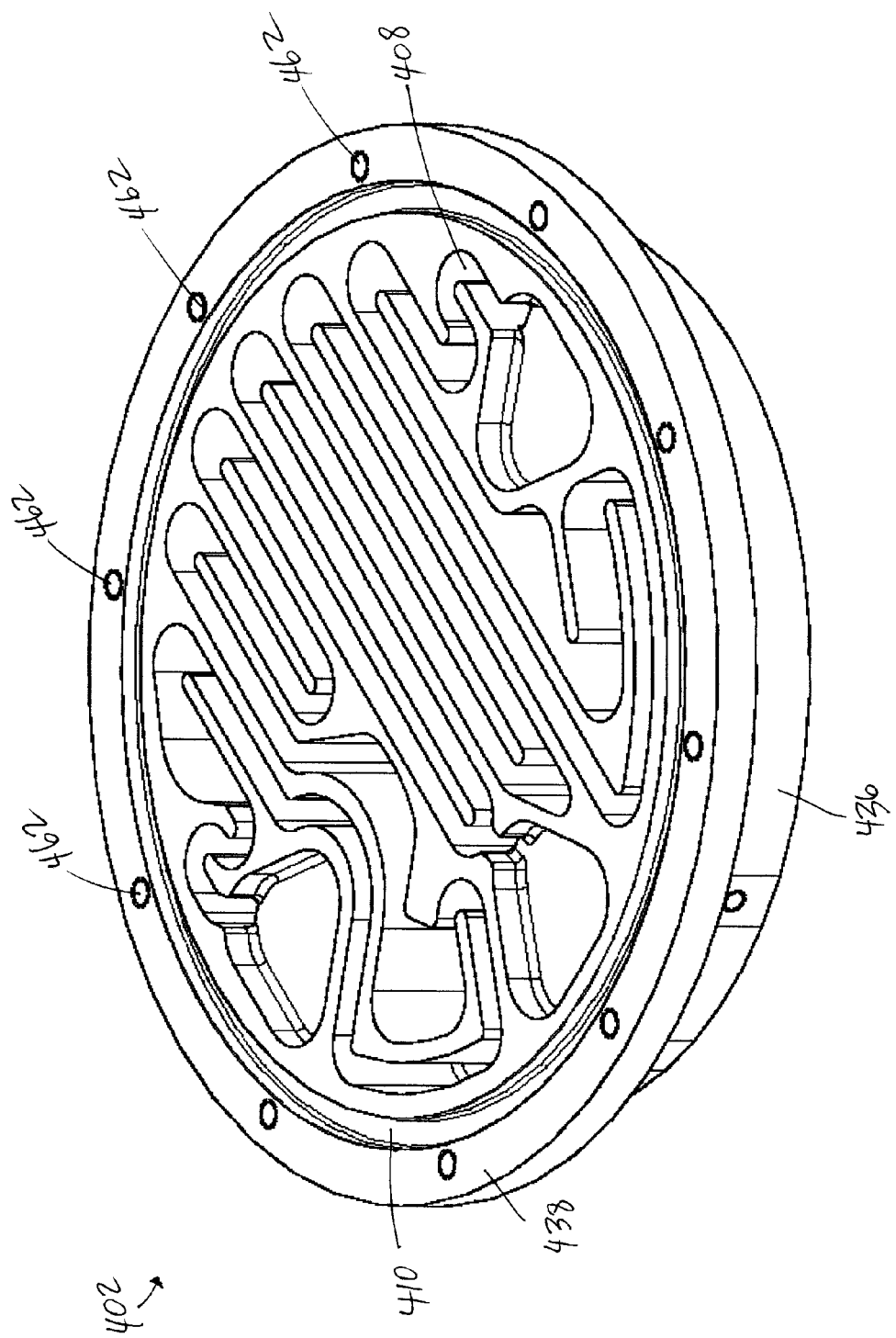
FIG. 11D is a top perspective view of an embodiment of a base for the precursor source vessel shown in FIG. 11A.

FIG. 11A shows another embodiment of an improved solid or liquid precursor source vessel 400 that includes a container base 402, a seal 404, and a lid 406. The lid 406 includes a plurality of integrated gas valves, or surface-mounted valves, described in more detail below. FIGS. 11B-11C illustrate an exemplary embodiment of the lid 406. FIGS. 11D-11G show an embodiment of the base 402 of the source vessel 400. FIGS. 11H-11I show other embodiments of the base 402 of the source vessel 400.

As shown in FIG. 11A, the base 402 is formed of a solid member that includes a recessed region 408 that is machined directly into the solid base 402. When the lid 406 is removably attached to the base 402, a seal 404 is disposed therebetween prior to the lid 406 being secured to the base 402 to ensure the contents within the source vessel 400 are secured therewithin. In an embodiment, the base 402 and the lid 406 are formed of the same material such that both members have substantially the same thermal conductivity and the same coefficient of thermal expansion therebetween. In another embodiment, the base 402 is formed of a material different than the material used to form the lid 406. In an embodiment, the base 402 and the lid 406 are formed of stainless steel. In other embodiments, the base 402 and/or lid 406 may be formed of high nickel alloys, aluminum, or titanium. It should be understood by one of ordinary skill in the art that the base 402 and the lid 406 can be formed of any other material sufficient to allow sufficient thermal heat transfer to vaporize the precursor disposed within the source vessel 400 while being inert, or not reacting with the precursor or contents within the source vessel 400.

A seal 404 is disposed between the base 402 and the lid 406 of the source vessel 400, as shown in FIG. 11A. In an embodiment, the seal 404 is an o-ring that is disposed within a groove 410 formed in the base 402. In another embodiment, the seal 404 can be formed as a metal gasket or a v-seal that is configured to be disposed between the base 402 and the lid 406. It should be understood by one of ordinary skill in the art that the seal 404 can be formed of any shape, size, or configuration sufficient to provide a seal when the lid 406 is attached to the base 402 and to ensure that the contents within the source vessel 400 are secured therewithin. In an embodiment, the seal 404 is formed of an elastomer, but it should be understood by one of ordinary skill in the art that the seal 404 may be formed of any other material sufficient to provide a seal, such as, but not limited to, polymer or metal.

As illustrated in FIGS. 11A-11C, an embodiment of a lid 406 of a source vessel 400 is shown. The lid 406 is formed as a single member having an upper surface 412, a lower surface 414, and a side surface 413 extending between the upper and lower surfaces 412, 414. In an embodiment, the upper and lower surfaces 412, 414 are substantially planar surfaces. It should be understood by one skilled in the art that the planar upper and lower surfaces 412, 414 may further include indentations, grooves, apertures, or inset portions formed therein. In an embodiment, the upper and lower surfaces 412, 414 are substantially parallel to each other, thereby providing the lid 406 with a consistent thickness $T_1$ across the entire lid 406. As shown in FIG. 11B, the upper surface 412 may include high-tolerance areas 416 that are machined so as to provide a substantially smooth area relative to the rest of the upper surface 412. These high-tolerance areas 416 allow the valve assemblies 418 to be mounted flush with the upper surface 412 of the lid 406 to ensure as much direct thermal contact between the valve assemblies 418 and the lid 406. With more surface area contact between these components, the heat transfer between these components can be maximized, thereby reducing the need for separate heaters or heating jackets to provide heat to the valve assemblies 418 which prevents condensation of vaporized precursor therewithin.

As shown in FIG. 11B, the lid 406 includes an inlet port 420, an outlet port 422, and a burp port 424. The inlet port 420 is configured to allow a carrier gas, or an inert gas, to be introduced into the source vessel 400 therethrough. The outlet port 422 is configured to allow gases to exit the source vessel 400 therethrough. The burp port 424 may comprise any port, such as a conventional inlet/outlet port, that may be configured to relieve head pressure within the source vessel 400 after either the initial fill and installation of the source vessel 400 or after subsequent re-fills and installations of the source vessel 400. The release of head pressure through the burp port 424 is done prior to the source vessel 400 providing vaporized precursor material to the reaction chamber 162 (FIG. 25) for semiconductor substrate processing. In an embodiment, an interface component 426 is operatively attached to the upper surface 412 of the lid 406 at each of the ports 420, 422, 424. Each interface component 426 is configured to be connected to a valve assembly 418. It should be understood by one of ordinary skill in the art that each valve assembly 418 and an interface component 426 may be operatively connected to the upper surface 412 of the lid 406 in any manner.

As illustrated in FIGS. 11A and 11C, one of the valve assemblies 418 includes a vent valve, or burp valve 428 that is operatively connected to the upper surface 412 of the lid 406. The burp valve 428 can be a pneumatic valve or any other valve that regulates the flow of gases into and out of the source vessel 400. In an embodiment, the burp valve 428 remains closed except when opened for release of gases to relieve the head pressure within the source vessel 400 prior to use of the source vessel 400 in a semiconductor processing system. During manufacture and initial filling of the source vessel 400 with precursor, or after the source vessel 400 is refilled with precursor, an inert gas is introduced into the source vessel 400 so as to create a head pressure within the source vessel 400. This head pressure is used to allow a leak check to be performed once the source vessel 400 is filled (or refilled), as explained above. When the source vessel 400 is being installed, the gases within the source vessel 400 that create the head pressure need to be removed and replaced with the inert carrier gas that will be used to carry the vaporized precursor during processing. Historically, the head pressure was relieved from source vessels commonly known in the art by exhausting the gases creating the initial head pressure through an outlet port which is the same outlet port through which vaporized precursor material exits during processing of a substrate. However, a filter adjacent to the outlet port would often become clogged by precursor particles that accompanied the gases during an initial "burp" process or release. Although some of the precursor particles were stopped by the outlet filter, some particles are able to bypass the filter—or particles caught by the filter would subsequently become dislodged—and enter into the tubing that leads to the reaction chamber. These errant precursor particles can cause non-uniform deposition within the reaction chamber or clog the gas lines between the source vessel and the reaction chamber. The errant particles may also cause particle entrainment on the semiconductor substrate being processed, thereby resulting in a reduction of the number of devices, chips, or circuits that the substrate can produce. The burp port 424 and corresponding burp valve 428 of the present invention allow the head pressure to be relieved during a "burp" process in which the gases and particles exiting the burp port 424 are first filtered by a burp filter 430 before being diverted through a burp gas line 432 that is connected directly to the exhaust line 466 (FIG. 25), thereby bypassing the reaction chamber 162 so as to prevent any unwanted particles from interfering with processing within the reaction chamber 162.

Figure 17:
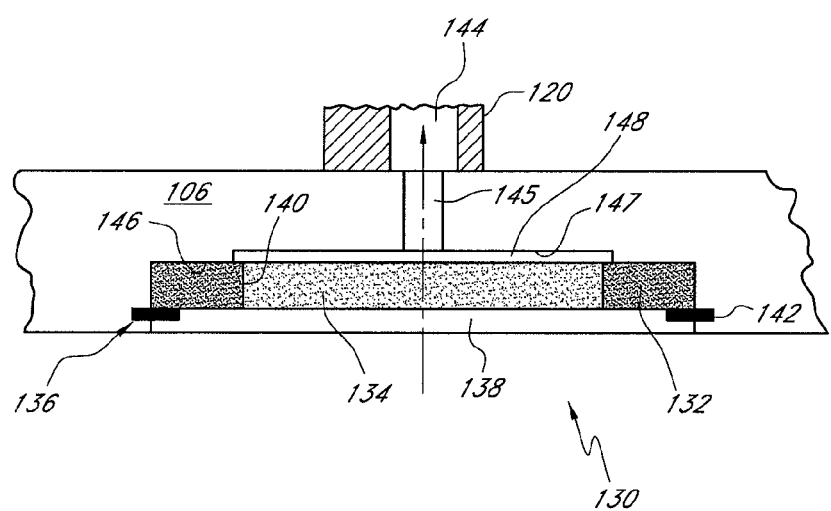
FIG. 17 is a sectional view of a filter mounted on a lid of a precursor source vessel.

As shown in FIG. 11C, a filtration apparatus 434 is operatively connected to the bottom surface 414 of the lid 406. A filtration apparatus 434, as shown in greater detail in FIG. 18 and described below, is configured to filter the carrier gas being introduced through the lid 406 into the source vessel 400 as well as the gases exiting the source vessel 400 through the burp port 424 and the outlet port 422. In the illustrated embodiment, a filtration apparatus 434 is attached to the underside of the lid 406 adjacent to the inlet port 420, the outlet port 422, and the burp port 424. The filtration apparatuses 434 are attached directly to the lid 406 to allow a sufficient amount of heat transfer from the lid 406 to prevent condensation of precursor material within each filtration apparatus 434. Each filtration apparatus 434 preferably has a low-profile, because a low-profile filtration apparatus provides good thermal uniformity across the filter pack media (FIG. 17).

Figure 11E:
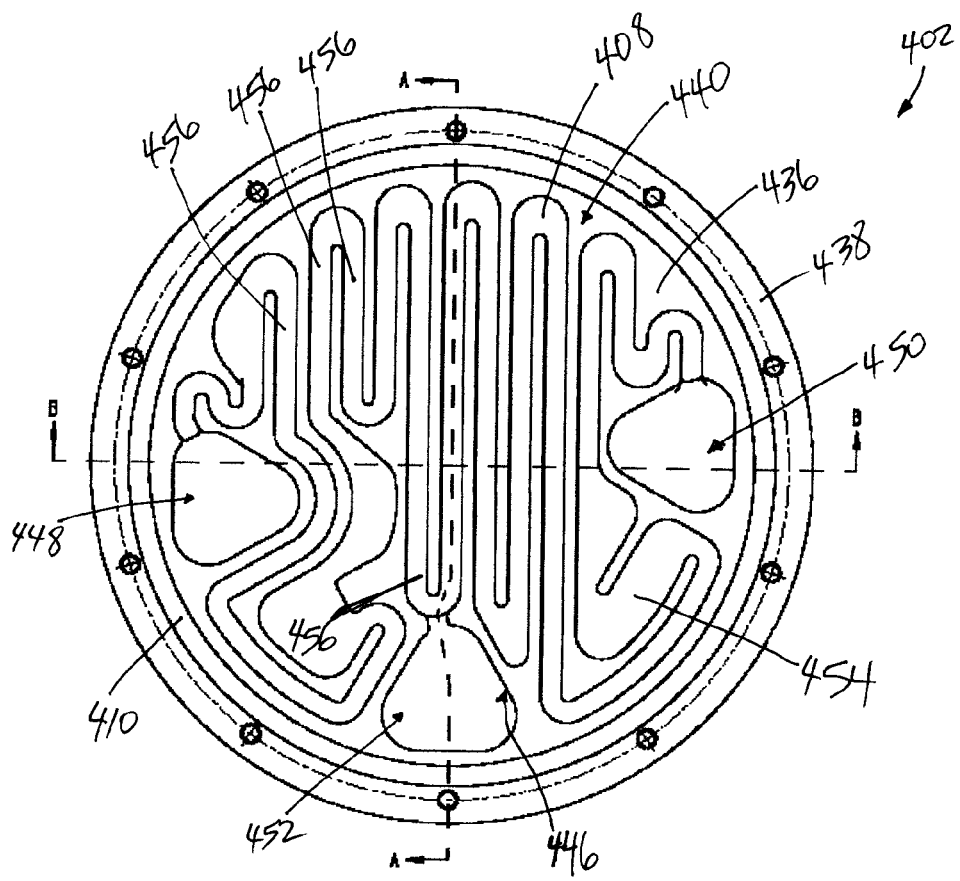
FIG. 11E is a top plan view of the base shown in FIG. 11D.
Figure 11F:
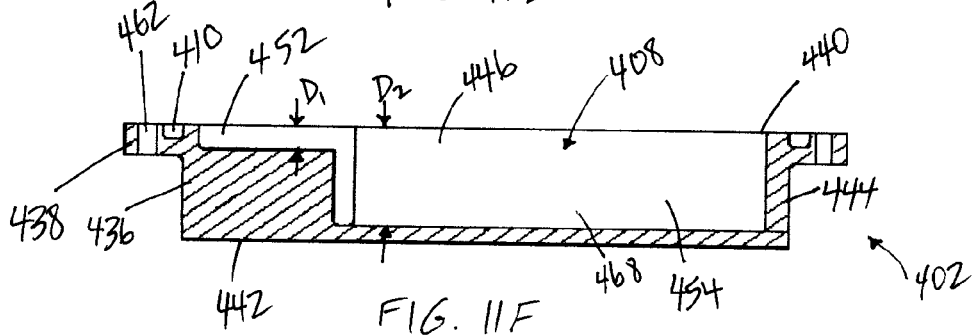
FIG. 11F is a cross-sectional view of the base shown in FIG. 11E taken along line A-A.
Figure 11G:
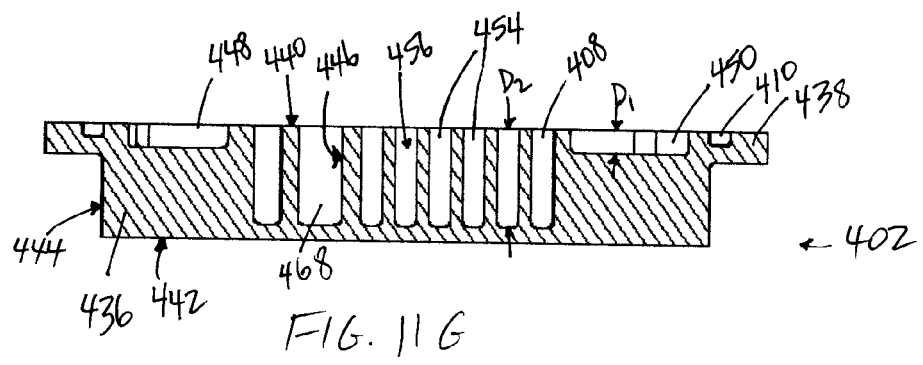
FIG. 11G is a cross-sectional view of the base shown in FIG. 11E taken along line B-B.
Figure 11H:
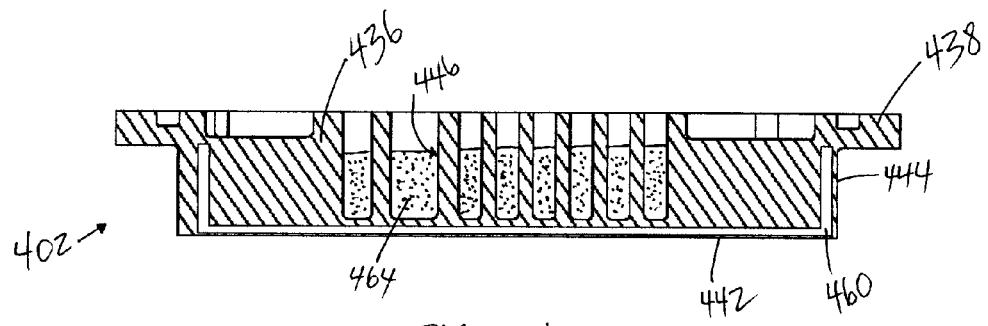
FIG. 11H is a cross-sectional view of another embodiment of a base for the precursor source vessel shown in FIG. 11A.
Figure 11I:
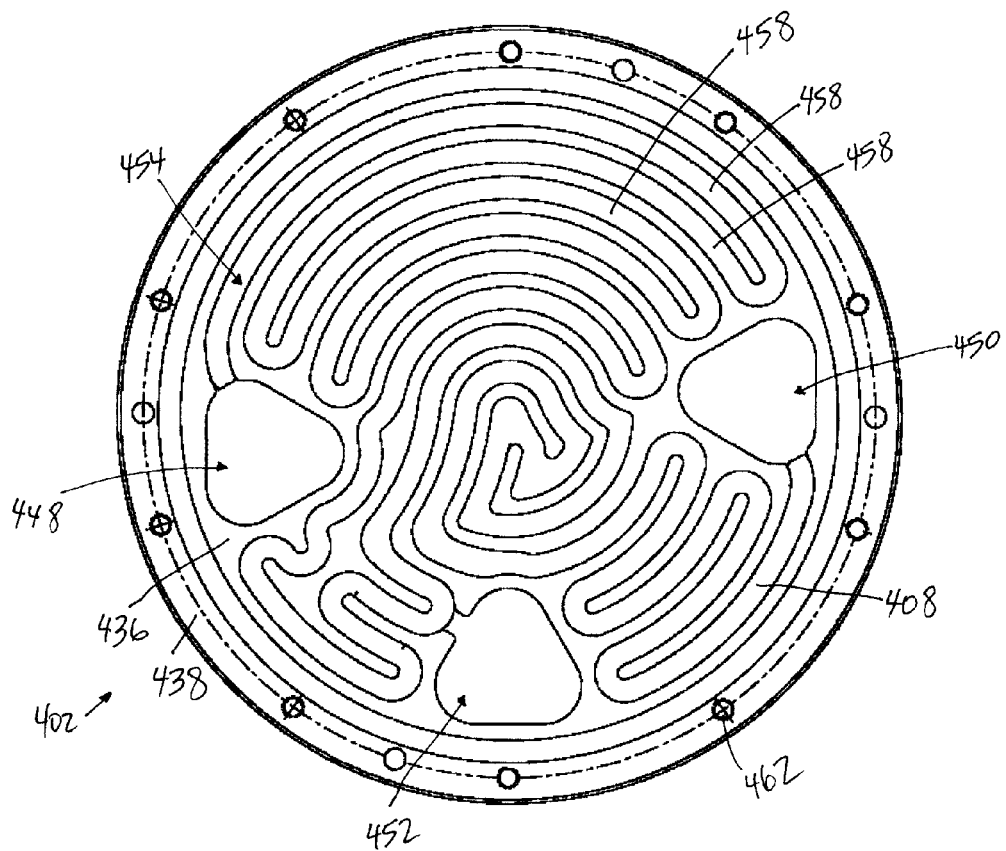
FIG. 11I is a top plan view of yet another embodiment of a base for the precursor source vessel shown in FIG. 11A.

An embodiment of a base 402 is shown in FIGS. 11E-11G. The base 402 includes a body 436 and a flange 438 that is integrally connected to the body 436 and extends therefrom. In an embodiment, the body 436 and the flange 438 are formed from a single piece of material. As explained above, a groove 410 is formed into the body 436, wherein the groove 410 is configured to receive the seal 404. The flange 438 is configured to extend radially outward from the upper portion of the body 436. The base 402 is defined by an upper, contact surface 440, a bottom surface 442, a side surface 444, and an inner surface 446 that defines and forms the recessed region 408. The contact surface 440 is a substantially planar surface that forms the entire upper surface of the base 402. The contact surface 440 is configured to directly contact the lower surface 414 of the lid 406.

In an embodiment, the base 402 is a solid piece of material or metal into which the recessed region 408 is machined, or removed, as illustrated in FIGS. 11D-11G. In another embodiment, the base 402 is formed as a one-piece casting in which the recessed region 408 is formed into the base 402 during the casting or forging process. The recessed region 408 is configured to receive a solid or liquid precursor therewithin. In the embodiments shown in FIGS. 11D-11I, the recessed region 408 is formed as an elongated, tortuous pathway extending from the contact surface 440 of the base 402. The inner surface 446 extends from the contact surface 440 into the thickness of the body 436. The depth that the recessed region 408 is formed into the body 436 may vary. It should be understood by one of ordinary skill in the art that the shape, depth, and width of the recessed region 408 may vary so long as the recessed region 408 allows for an extended flow path between the inlet and outlet ports 420, 422 in order to increase the residence time of gases with the precursor material disposed within the recessed region 408.

In an embodiment, as shown in FIGS. 11E-11G, the recessed region 408 includes an inlet recessed pad 448, an outlet recessed pad 450, a burp recessed pad 452, and a channel 454 that fluidly connects the recessed pads 448, 450, 452. The recessed pads 448, 450, 452 are generally triangular-shaped recessed regions extending downwardly from the contact surface 440 of the base 402. The shape of the recessed pads 448, 450, 452 are substantially the same shape and size of the portion of the corresponding filtration apparatus 434 that extends from the lower surface 414 of the lid 406 into the base 402 such that a portion of each filtration apparatus 434 is received within a corresponding recessed pad 448, 450, 452. The recessed pads 448, 450, 452 extend downwardly from the contact surface 440 to a predefined depth. In an embodiment, the depth of all of the recessed pads 448, 450, 452 is the same. In another embodiment, the depth of at least one of the recessed pads 448, 450, 452 is different than the depth of the others. When the base 402 is filled with precursor, the volume within each of the recessed pads 448, 450, 452 is not filled with precursor. When a carrier gas is introduced into the base 402 through the filtration apparatus 434 adjacent to the inlet port 420 of the lid 406, the carrier gas contacts and is distributed within the inlet recessed pad 448 before traveling throughout the remainder of the recessed region 408. Because there is preferably no precursor located within any of the recessed pads 448, 450, 452, the introduction of a carrier gas into the inlet recessed pad 448 prevents the carrier gas from directly contacting the precursor and potentially stifling up the precursor or causing particles of the precursor to be intermixed with the carrier gas. Each of the recessed pads 448, 450, 452 of the recessed region 408 is fluidly connected by way of the channel 454 formed into the body 436.

As illustrated in FIGS. 11F-11G, the channel 454 of the recessed region 408 extends from the contact surface 440, wherein the channel 454 is a continuous pathway along which gases can travel between the inlet recessed pad 448 and the outlet recessed pad 450. In another embodiment, the recessed region 408 does not include recessed pads such that the channel 454 extends the entire distance between the filtration apparatus 434 adjacent to the inlet port 420 and the filtration apparatus 434 adjacent to the outlet and burp ports 422, 424. The channel 454 is formed into the body 436 such that the channel 454 has a depth that is greater than the depth of the recessed pads 448, 450, 452. In an embodiment, the depth of the channel 454 is constant along the entire length of the channel 454 between the inlet recessed pad 448 and the outlet recessed pad 450. In another embodiment, the depth of the channel 454 varies along the length of the channel 454 between the inlet recessed pad 448 and the outlet recessed pad 450.

When the source vessel 400 is filled with liquid or solid precursor material (not shown), the precursor material is preferably disposed only within the channel 454 of the recessed region 408 formed in the body 436. The channel 454 should be filled to a depth that is below the bottom surface of the recessed pads 448, 450, 452 to prevent any of the precursor material from being disposed within the recessed pads 448, 450, 452. Further, the bottom surface of the outlet recessed pad 450 is located above the upper surface of the precursor material such that any precursor material particles remain within the channel 454.

In the embodiment of the base 402 shown in FIG. 11E, the channel 454 extends between the inlet recessed pad 448 and the outlet recessed pad 450 and has a serpentine shape. The channel 454 forms a tortuous pathway between the inlet and outlet ports 420, 422 along which a carrier gas can travel. In other words, the channel 454 between the inlet and outlet recessed pads 448, 450 is non-linear between the inlet and outlet ports 420, 422. In the embodiment illustrated in FIGS. 11E-11G, the channel 454 includes a plurality of linear sections 456. Further, at least two adjacent linear sections 456 are substantially parallel to each other. The channel 454 has a width. In an embodiment, the channel 454 has a constant width along the entire length thereof. In another embodiment, the width of the channel 454 varies along the length thereof. The serpentine shape of the channel 454 maximizes the amount of time and distance that the carrier gas introduced into the source vessel 400 is in contact with precursor material disposed within the recessed region 408.

In another embodiment of a base 402 of a source vessel 400, the channel 454 extends between, and is in fluid communication with, the inlet recessed pad 448 and the outlet recessed pad 450, as illustrated in FIG. 11H. The channel 454 includes a plurality of arced sections 458. In an embodiment, the channel 454 includes at least two arced sections 458 that are substantially concentric with respect to each other. In another embodiment, the channel 454 includes a plurality of arced sections 458 but no linear sections 456. In another embodiment of a base 402 (not shown), the channel 454 is a completely random, tortuous pathway extending between the inlet recessed pad 448 and the outlet recessed pad 450 or between the inlet and outlet ports 420, 422.

FIG. 11H illustrates an embodiment of a base 402 that further includes a heating assembly 460 disposed within the base 402. In an embodiment, the heating assembly 460 is integrated into the walls of the base 402 between the side and bottom surfaces 444, 442 and the inner surface 446. The heating assembly 460 is configured to provide direct heat to the base 402 so as to vaporize the precursor material 464 disposed therewithin. In an embodiment, the heating assembly 460 may be a wire heater integrally formed within the base, or any other type of heating mechanism sufficient to provide direct heat to the base 402 while being integrated therewithin. In another embodiment, the heating assembly 460 may also be a resistive element embedded in the base 402. In yet another embodiment, the heating assembly 460 may be a thin foil heating element embedded within the base 402. It should be understood by one of ordinary skill in the art that the heating assembly 460 may include any heating means that provides direct heating to the body 436 of the base 402 so as to provide a sufficient amount of heat to vaporize the precursor material 464.

Figure 11J:
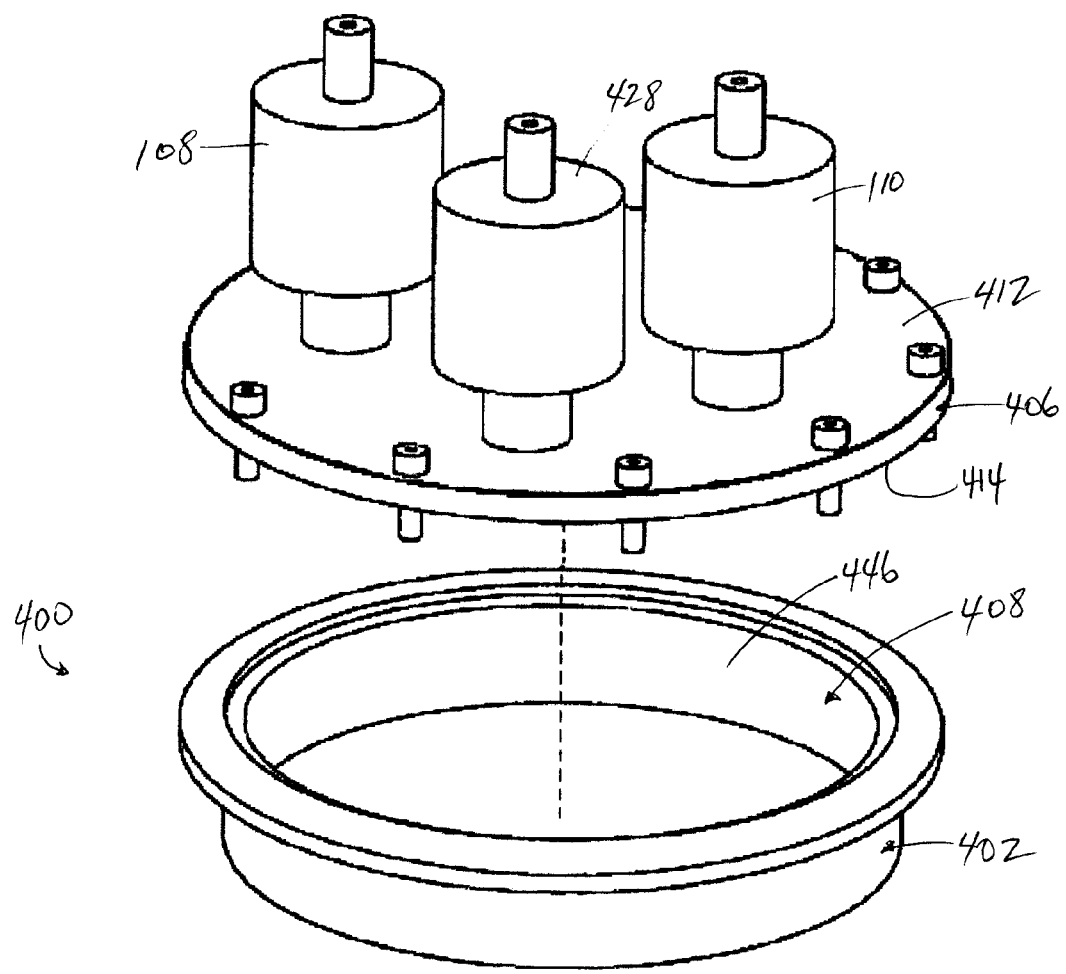
FIG. 11J is an exploded perspective view of another embodiment of a source vessel.

In another embodiment of a base 402 of a source vessel 400, a recessed region 408 is formed into the base 402 to provide a generally hollow volume within the base 402 to receive a precursor material, as shown in FIG. 11J. Although the embodiment illustrated in FIG. 11J does not include a channel or tortuous pathway similar to the embodiments above, the recessed region 408 provides for an extended, non-linear pathway within the base 402 between the inlet and outlet ports 420, 422.

When the source vessel 400 is assembled, the lid 406 is removably attached to the base 402 with the seal 404 disposed therebetween. When the lid 406 is attached to the base 402, an interior volume 468 is defined between the inner surface 446 that forms the recessed region 408 in the base 402 and the lower surface 414 of the lid 406. The lid 406 includes a plurality of apertures 462 formed through the entire thickness $T_1$ thereof, as shown in FIG. 11B. The apertures 462 formed through the lid 406 are located adjacent to the outer edge of the lid 406. The base 402 also includes a plurality of apertures 462 formed through the entire thickness of the flange 438, as shown in FIG. 11D. The lid 406 is aligned with the base 402 such that each of the filtration apparatuses 434 attached to the lid 406 are received within a corresponding recessed pad 448, 450, 452 of the base 402. The seal 404 is disposed within the groove 410 formed in the base 402. When the lid 406 and base 402 are aligned, the apertures 462 formed in the lid 406 likewise are aligned with the apertures 462 formed in the base 402. A connecting member (not shown) is inserted through each pair of corresponding apertures 462 in the base 402 and lid 406 such that the lid 406 is removably sealed to the base 402. It should be understood by one of ordinary skill in the art that any type of connecting member can be used to removably attach the lid 406 to the base 402, including, but not limited to, screws, bolts, or clamps. When completely assembled, the lower surface 414 of the lid 406 is in abutting contact with the contact surface 440 of the base 402. The contact between the lid 406 and the contact surface 440 of the base 402 provides for direct heat transfer between the lid 406 and the portions of the body 436 immediately adjacent to the recessed region 408 so as to transfer heat through the base 402 to the precursor material disposed within the interior volume 468. It should be understood by one skilled in the art that the lower surface 414 of the lid 406 and the contact surface 440 of the base 402 are both substantially planar such that when these surfaces 414, 440 are in contact with each other, the abutting relationship between the lid 406 and the base 402 provides a seal between adjacent portions of the channel 454 (FIGS. 11E and 11I) so that carrier gas and vaporized precursor material does not bypass the portions of the channel 454 by passing between the lid 406 and the base 402.

In an operation for processing a semiconductor substrate in the reaction chamber 162 (FIG. 25), a carrier gas in introduced into the source vessel 400 through the inlet port 420 in the lid 406. A precursor material 464 is disposed within the source vessel 400, and the source vessel 400 is heated, thereby vaporizing the precursor material. The carrier gas then passes through the filtration apparatus 434 located adjacent to the inlet port 420 and then into the interior volume 468 of the base 402 defined by the inner surface 446 forming the recessed region 408 and the lower surface 414 of the lid 406. When entering the interior volume 468, the carrier gas enters the inlet recessed pad 448 and then disperses through the channel 454. As the carrier gas travels through the interior volume 468, the carrier gas mixes with the vaporized precursor material 464 (FIG. 11H) to form a gas mixture that is saturated with the vaporized precursor material. The longer the residence time in which the carrier gas remains within the interior volume 468, the more saturated with vaporized precursor material the carrier gas becomes. It should be understood by one of ordinary skill in the art that there is a limit to the saturation level of the carrier gas by the vaporized precursor material, and the length of the pathway within the interior volume 468 between the inlet and outlet ports 420, 422 is optimized to maximize the amount of saturation of the carrier gas. This gas mixture eventually exits the interior volume 468 by passing through the filtration apparatus 434 operatively connected to the lid 406 and located adjacent to the outlet port 422. After passing through the filtration apparatus 434, the gas mixture exits the source vessel 400 through the outlet port 422 and into the outlet gas line 470 (FIG. 25) that is in fluid communication with a reaction chamber 162.

In a burp process, the gas or gases within the interior volume 468 of the source vessel 400 creating a head pressure therewithin that are added after the initial fill or refill of the source vessel 400 are removed. In the burp process, as shown in the schematic drawing of FIG. 25, the burp valve 428 is opened to allow the gases within the source vessel 400 to exit the interior volume 468 through the burp port 424. The head pressure gases pass through the burp filter 430 operatively connected to the lid 406 adjacent to the burp port 424. After passing through the burp filter 430, the head pressure gas exits the source vessel 400 through the burp port 424 and into a burp gas line 432 that bypasses the reaction chamber 162 and is fluidly and operatively connected to an exhaust line 466 through which effluent from the reaction chamber 162 flows. Once the gases that created the initial head pressure exit the source vessel 400 such that the pressure within the source vessel 400 is equalized, a carrier gas is introduced through the filtration apparatus 434 attached to the lid 406 located adjacent to the inlet port 420 and then into the interior volume 468 of the base 402 to fill the recessed region 408 with the carrier gas to a pre-determined operating pressure.

Figure 12:
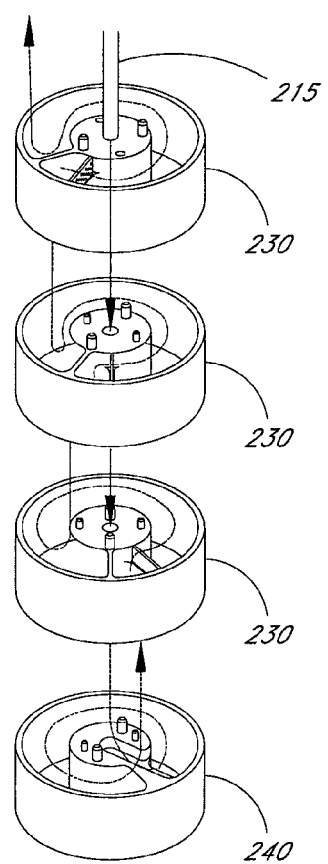
FIG. 12 is an exploded perspective view of an embodiment of a serpentine insert comprising a stack of trays.

In another alternative embodiment, illustrated in FIGS. 12-16, the serpentine insert 112 comprises a plurality of stacked trays that collectively define a serpentine gas flow path. For example, FIG. 12 shows a plurality of stacked trays 230, 240 that are configured to be removably inserted into a container body 104 (FIGS. 7-10) and that collectively define a spiral gas flow path that comprises at least a portion of the tortuous path of the vessel 100. In FIGS. 12-16, the heights of the trays 230, 240 are enhanced for ease of illustration. It should be understood that the trays can be made vertically thinner so that the vessel 100 has a diameter significantly greater than its overall height.

In the illustrated embodiment, four trays are stacked: three upper trays 230 and one lower tray 240. The number of trays can vary based on parameters such as the sublimation rate, carrier flow, etc.

Figure 13:
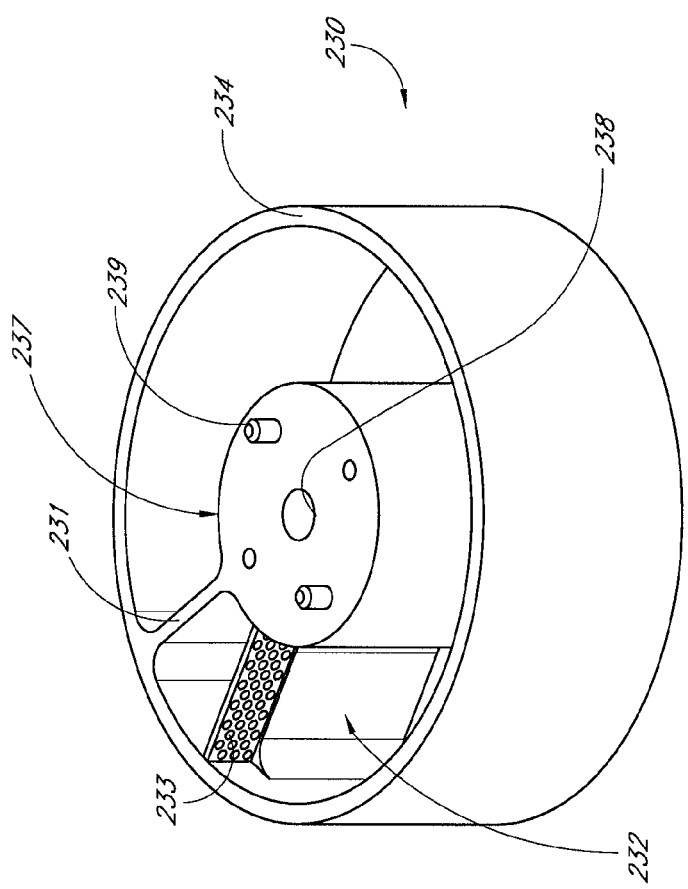
FIG. 13 is a perspective view of an upper stacking tray of the serpentine insert of FIG. 12.
Figure 14:
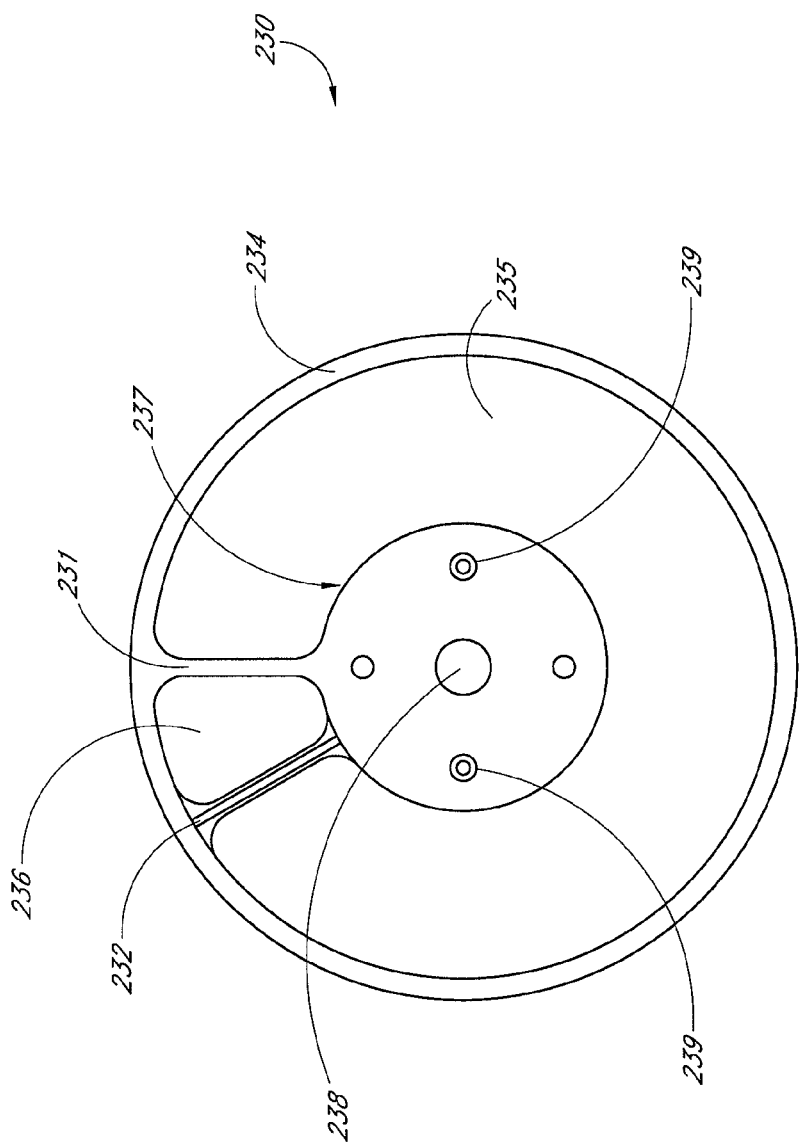
FIG. 14 is a top view of the upper stacking tray of FIG. 13.

Referring to FIGS. 13 and 14, each upper tray 230 includes a solid divider 231, preventing gas flow therethrough and extending the full height of the tray 230, and a partial divider 232 that allows gas flow therethrough. Preferably, the partial divider includes a screen 233 configured to retain large precursor particulates while allowing free gas flow therethrough. In the illustrated embodiment, the screen 233 extends across the top portion of the partial divider 232, while a solid panel completes the height of the partial divider 232. An annular rim 234 also extends the height of the upper tray 230. The solid divider 231 and the partial divider 232 together define a main compartment 235 for holding solid source material (not shown) and an outer channel compartment 236 that is open at the lower surface of the tray 230. The illustrated upper tray 230 has a central core 237 that includes a central channel 238 to accommodate a gas inlet pipe that delivers carrier gas to the bottom tray 240. The illustrated upper tray 230 also has a plurality of pegs 239 on an upper surface thereof and a corresponding plurality of holes (not shown) on a bottom surface thereof for receiving the pegs of another tray therebelow. As will be better understood in view of the operation, described hereinbelow, the holes on the lower surface of the central core 237 are desirably rotationally offset relative to the pegs 239 on the upper surface, serving to properly align the plurality of trays upon one another to define the winding flow path. In certain preferred embodiments, the corners in the main compartment to which the flow is exposed are rounded to minimize flow stagnation from sharply angled corners.

Figure 15:
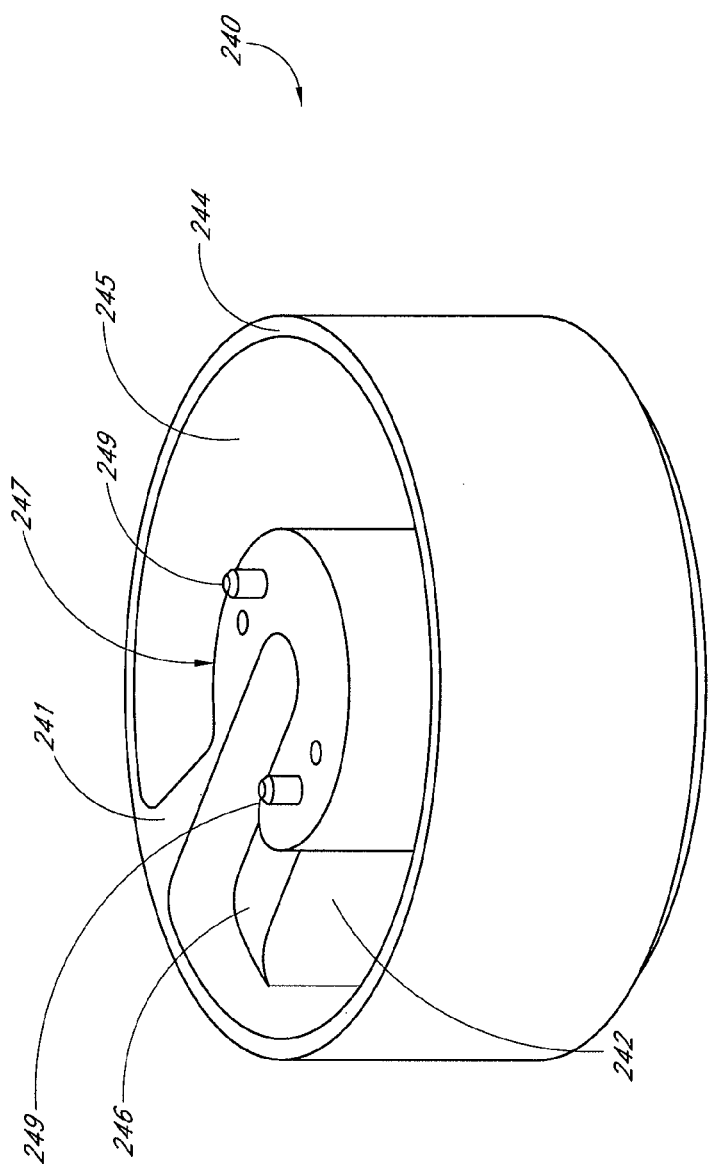
FIG. 15 is a perspective view of a lower stacking tray of the serpentine insert of FIG. 12.
Figure 16:
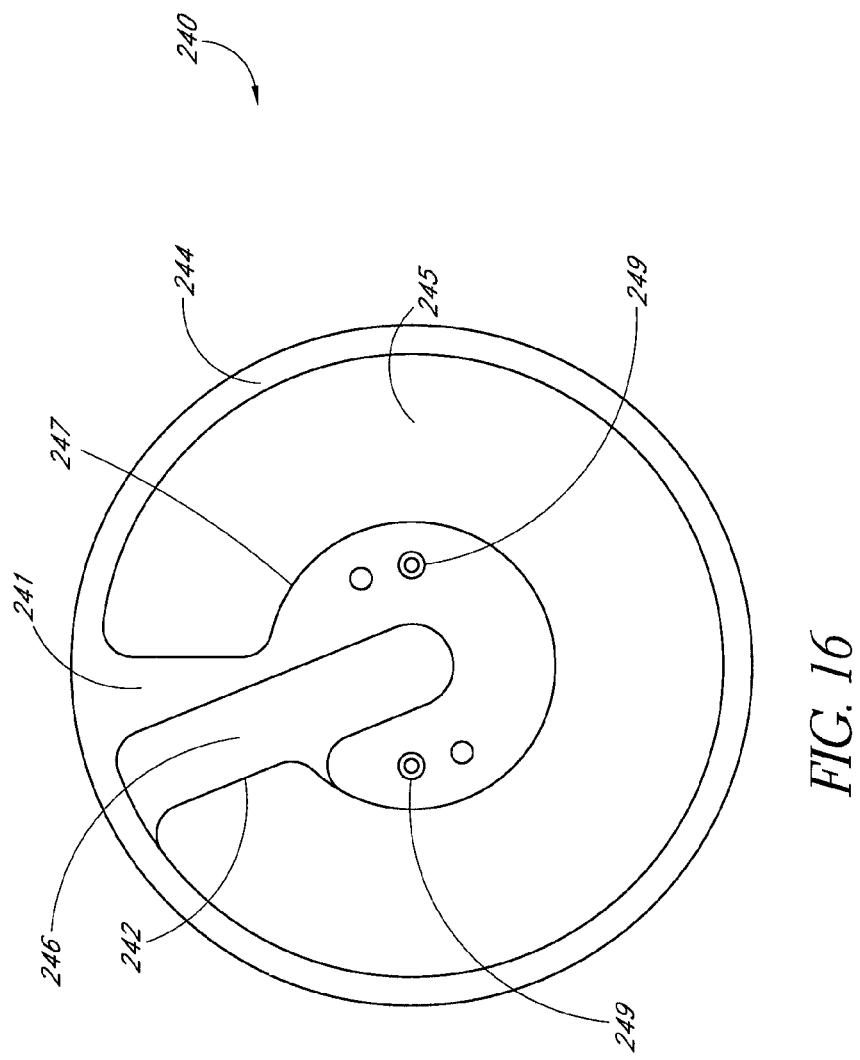
FIG. 16 is a top view of the lower stacking tray of FIG. 15.

Referring to FIGS. 15 and 16, the lowest tray 240 comprises a solid divider 241, preventing gas flow therethrough and extending the full height of the tray 240, and a partial divider 242 that allows gas flow thereover. Preferably, the partial divider 242 simply provides an opening to the central channel 238 in the middle of the overlying upper tray 230, as will be better understood in view of the description of FIG. 12. An annular rim 244 also extends the height of the lower tray 240. The rim 244, the solid divider 241 and the partial divider 242 together define a main compartment 245 for holding solid source material (not shown) and an outer channel compartment 246. In preferred embodiments, the solid source material only fills the main compartment 245 up to and even with channel compartment 246. In alternate embodiments, the solid source material fills the between one third and two thirds of the height of the main compartment. The illustrated lower tray 240 also has a central core 247 into which the channel compartment 246 protrudes, a plurality of pegs 249 on an upper surface thereof and a corresponding plurality of holes (not shown) on a bottom surface thereof for receiving pegs that protrude upwardly from a floor of the container body 104 (FIGS. 7-10).

The stack of trays 230, 240 is assembled as shown in the exploded view of FIG. 12. The main compartments 235, 245 for each of the upper trays 230 and the lower tray 240 are loaded with a precursor source chemical, preferably in the form of powder. The lower tray 240 and plurality of upper trays 230 are stacked upon one another and loaded into the external container body 104. The trays 230, 240 are aligned by the pegs 239, 249 and corresponding holes such that gas flows into each tray, preferably at least flowing a lap of within 200°-355° around the main compartment and then up into the channel compartment 236 of the overlying upper tray 230. The container lid 106 (FIGS. 7 and 8) is then closed and sealed over the container body 104, and a central pipe 215 extending from the lid extends down through the central channels 238 of the upper trays 230 to open into the channel compartment 246 of the lower tray 240. FIG. 12 shows the central pipe 215 but not the lid 106. The central pipe 215 is configured to deliver carrier gas conveyed into an inlet of the vessel 100. In certain preferred embodiments, a spring or other biasing device (not shown) is often placed below 240 to bias all the trays together, preventing leaks from the central core to a different level.

In operation, inert gas is preferably delivered to the stack of trays 230, 240, and experiences a long and winding flow route horizontally, preferably through an arc of about 200°-350° of the main compartment in each tray 230, 240 before vertically exiting that tray. In the illustrated embodiment, inert carrier gas is provided through a central inlet 215 that extends down through the aligned central channels 238 of the upper trays 230 to open into the channel compartment 246 of the lower tray 240. The inert gas winds through the precursor source chemical in the main compartment 245 until encountering an opening in the lower surface of the overlying upper tray 230. This opening allows the carrier gas, and the vaporized precursor it carries with it, to pass into the channel compartment 236 of the overlying upper tray 230, from which the gas passes through the screen 233 (FIG. 13) and into the main compartment 235. The gas winds through solid precursor in that main compartment 235, preferably through an arc of about 200°-350° before encountering an opening in the lower surface of the overlying upper tray 230, etc. At the uppermost upper tray 230, the gas is allowed to exit the vessel 100, preferably through a surface-mounted outlet valve 110 (described below) at the lid vessel 106. It will be understood, of course, that the flow path can be reversed if desired. In other words, the inert carrier gas can begin in a top tray and flow downward through the stack of trays.

Referring again to FIGS. 8-10, in the illustrated embodiment the vessel lid 106 includes an inlet valve 108 and an outlet valve 110. The inlet valve 108 has an inlet end that receives carrier gas via a conduit 121. The conduit 121 has a fitting 122 adapted for connection to a fitting 131 (FIG. 7) of a gas line 133 of a gas interface assembly 180 (described below). The inlet valve 108 also has an outlet end that is preferably in fluid communication with a first portion 117 (such as an end portion) of the serpentine path 111 of the insert 112. The outlet valve 110 has an inlet end that is preferably in fluid communication with a second portion 119 (such as an end portion) of the serpentine path 111, and an outlet end in fluid communication with a suitable gas outlet of the lid 106, such as an orifice 128. In use, carrier gas flows into the conduit 121 and through the inlet valve 108, serpentine path 111, and outlet valve 110 before exiting from the orifice 128. Thus, results that may be achieved by this embodiment include mounting the isolation valves onto the surface of the lid 106, and causing the carrier gas to flow along a tortuous or serpentine path while it is exposed to the precursor source. Skilled artisans will appreciate that the vessel 100 can be configured differently.

As explained above, conventional solid or liquid precursor source vessels include discrete tubes that extend from the vessel body or lid, with the valves being attached inline with such tubes. For example, the conventional vessel 31 of FIG. 2 includes discrete tubes 43b and 45b extending upward from the lid 35, with the valves 37 and 39 being attached to such tubes. The valves 37 and 39 of the vessel 37 are not directly attached to or in contact with the lid 35. As a result, the reactant gas from the vessel 31 flows out of the outlet tube 45b and then into the outlet valve 39, which may involve a flow path with stagnant or dead gas volumes. In addition, the isolation valves 37, 39, and 41 of the conventional vessel 31 are significantly thermally isolated from the vessel lid 35 and body 33. Both the tubing and the valves are very difficult to effectively heat with three-dimensional geometry, regardless of the presence or absence of dead volumes or "dead legs." The valves have a smaller thermal mass than the lid 35 and body 33 and therefore tend to heat up and cool down faster. That is why, in conventional systems, additional heaters (such as line heaters, cartridge heaters, directed heat lamps, etc.) are often used specifically to provide heat to the valves and associated tubing during system cool-down, to prevent such components from cooling down faster than the vessel 31 (which can create an unwanted condition in which reactant vapors flow into such components and deposit thereon). Another problem with the conventional valves and tubing is that they can heat up faster than the vessel 31. For some precursors, this can create a condition in which the valves and tubing become warmer than the decomposition temperature of the precursor, causing the precursor to decompose and deposit thereon.

In contrast, the isolation valves 108 and 110 (FIGS. 7-10) of the source vessel 100 are preferably mounted directly to the surface of the lid 106 of the vessel 100. Such surface mount technology may be referred to as an integrated gas system. In comparison to conventional precursor source vessels (e.g., FIG. 2), the surface-mounted valves 108 and 110 can reduce the volume of dead legs (stagnant reactant gas flow) in the gas delivery system by eliminating tubing between the valves and the vessel 100, which simplifies and shortens the travel path of the reactant gas. The valves and tubing are much more amenable to heating due to the compressed geometry and improved thermal contact, which lessens temperature gradients. The illustrated surface-mounted valves 108 and 110 have valve porting blocks 118 and 120, respectively, which preferably include valve seats and adjustable flow restrictors (e.g., diaphragms) for selectively controlling gas flow through the valve seats. Such valves 108 and 110 isolate the vessel 100 by restricting all gas flow through the valve seats. The porting blocks 118, 120 can be formed integrally with the vessel lid 106 or can be separately formed and mounted thereon. In either case, the porting blocks 118, 120 preferably have a relatively high degree of thermal contact with the vessel lid 106. This causes the temperatures of the valves 108 and 110 to remain close to that of the lid 106 and container body 104 during temperature changes of the vessel 100. This surface-mounted valve configuration can reduce the total number of heaters required to prevent condensation of vaporized precursor gas. When the vessel 100 is above the vaporization temperature of the precursor source chemical, vaporized precursor can freely flow to the valves 108 and 110. Since the valves 108, 110 closely track the temperature of the vessel 100 during temperature ramping, the valves are also likely to be above the vaporization temperature, thus reducing the need for additional heaters to prevent condensation of the precursor in the valves. The shortened gas flow paths are also better suited for controlled heating. The surface-mounted valves 108 and 110 also have a much smaller packaging space requirement.

Figure 25:
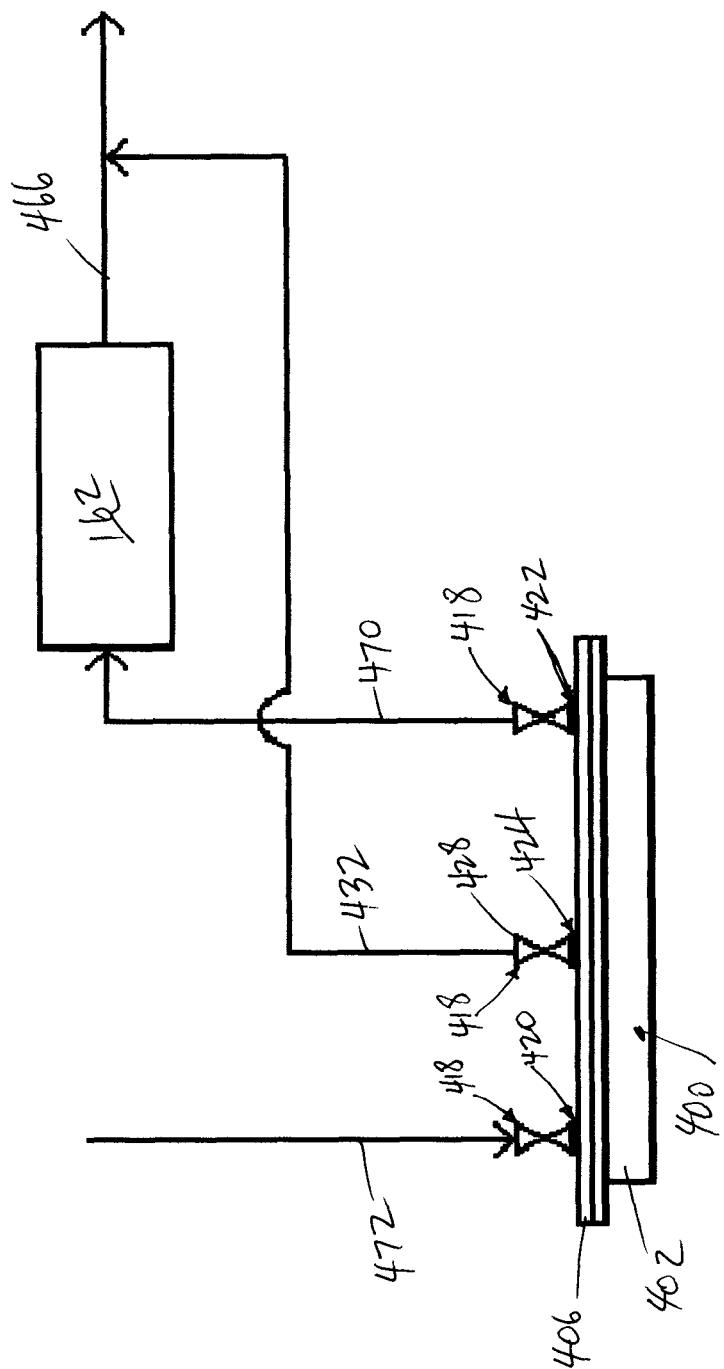
FIG. 25 is a schematic illustration of a gas delivery system for flowing carrier and reactant gases through a precursor source vessel and a reaction chamber.

In another embodiment, the valving of the porting blocks 118, 120 (FIG. 8) can be integrally formed within the lid 406 of the source vessel 400, thereby allowing the inlet and outlet valves 108, 110 as well as a burp valve 428 to be attached directly to the lid 406 such that the inlet, burp, and outlet valves 108, 428, 110 are mounted flush with the upper surface 412 of the lid 406, as illustrated in FIG. 11J. Mounting the valves directly and flush with the upper surface 412 of the lid 406 increases the heat transfer therebetween as well as further reduce the distance the inert gas and vaporized precursor mixture must travel from the interior volume 468 of the base 402 to the reaction chamber 162 (FIG. 25).

Each of the valves 108 and 110 preferably comprises a valve porting block including gas flow passages that can be restricted or opened by the valve. For example, with reference to FIGS. 9 and 10, the porting block 118 of valve 108 preferably includes an internal gas flow passage extending from the conduit 121 through one side 123 of the porting block 118 to a region 113. The region 113 preferably includes an internal apparatus (not shown) for restricting the flow of the gas, such as a valve seat and a movable restrictor or diaphragm. In one embodiment, the movable internal restrictor or diaphragm can be moved by turning a knob (e.g., the larger cylindrical upper portion 181 of the valve 108) either manually or in an automated fashion. Another internal gas flow passage preferably extends from the region 113 through an opposite side 125 of the block 118 to an inlet passage that extends through the lid 106 into the vessel 100. For example, the inlet passage can extend into the tortuous path 111 defined by the serpentine insert 112. The valve 110 and vent valve 210 (described below with reference to FIGS. 26-28) can be configured similarly to valve 108. In one embodiment, the valves 108 and 110 are pneumatic valves. It is particularly preferred to form the valve porting blocks 118 and 120 integrally with the vessel lid 106. This eliminates the need for separate seals therebetween.

In another embodiment, the valves 108, 110, and 210 (FIGS. 26-28) are formed without porting blocks, such as porting blocks 118, 120, and are preferably formed integrally with a portion of the vessel 100, such as the vessel lid 106.

Filter

Figure 26:
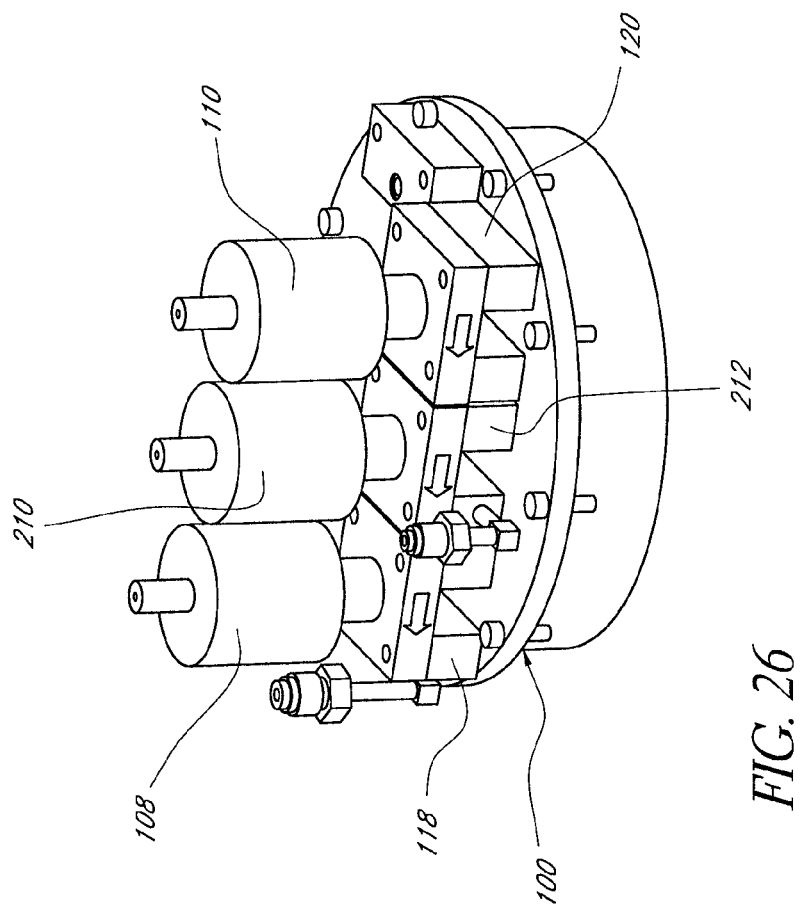
FIG. 26 is a perspective view of a precursor source vessel with a vent valve.
Figure 27:
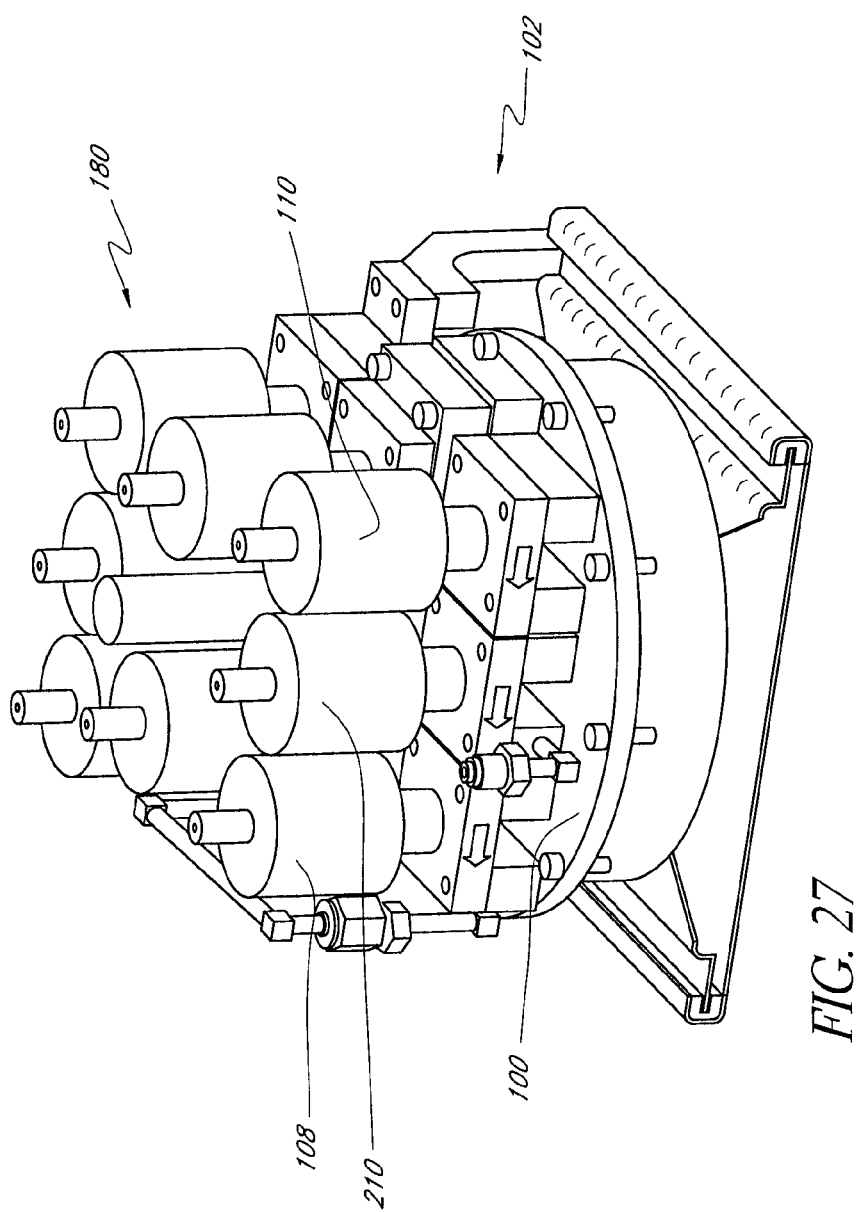
FIG. 27 is a perspective view of the vessel of FIG. 26 connected to the gas interface assembly of FIGS. 22-24.
Figure 28:
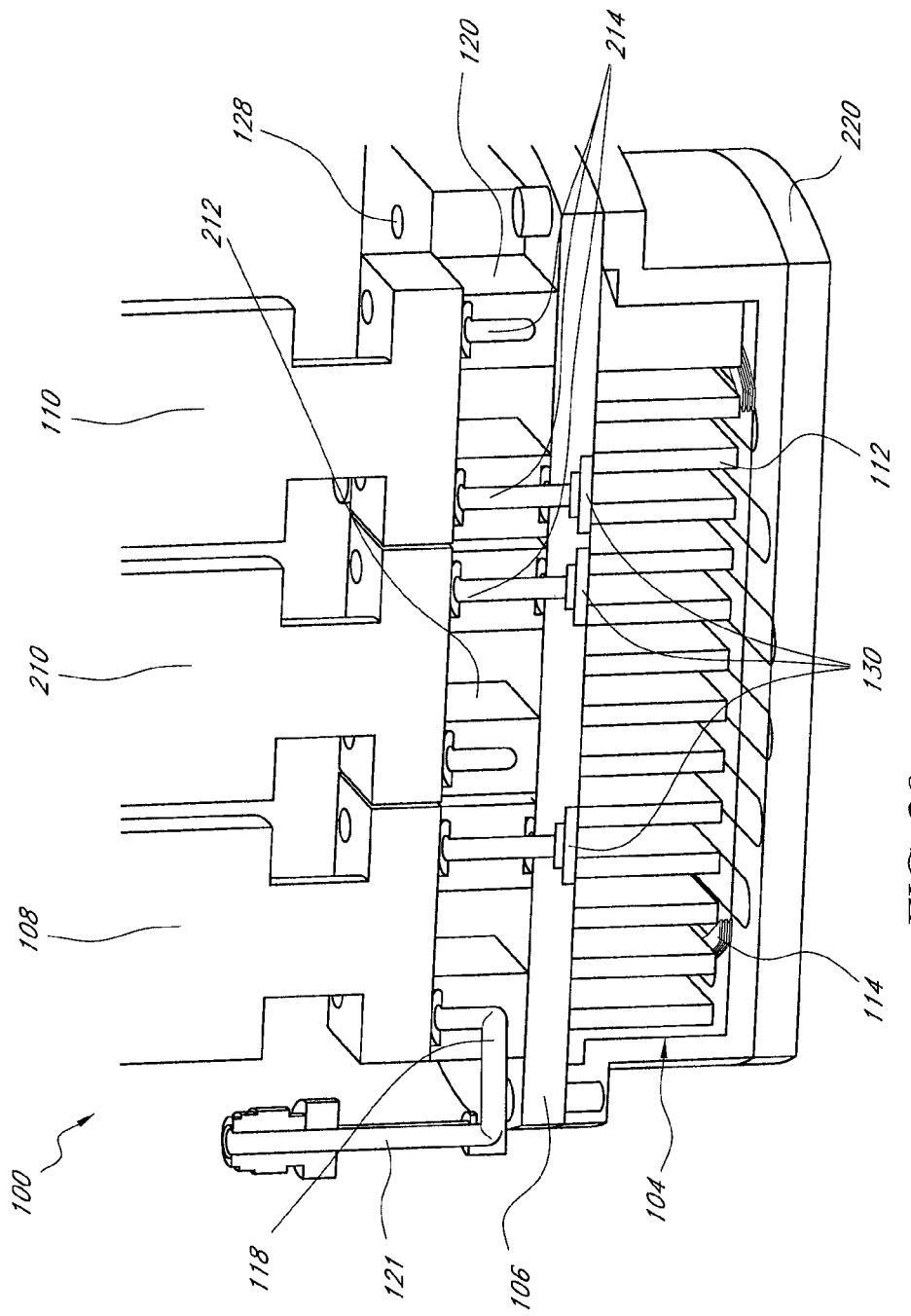
FIG. 28 is a sectional view of the vessel of FIG. 26, with the addition of a dedicated heating device for the vessel.

Preferably, the precursor source vessel includes a filtration apparatus for filtering the gas flow through the vessel, to prevent particulate matter (e.g., the source chemical's powder) from escaping the vessel. The filtration apparatus can be provided in a lid of the vessel, preferably underneath a surface-mounted valve 108, 110, and/or 210 (FIGS. 26-28). Preferably, the filtration apparatus comprises a separate filter for each inlet and outlet of the vessel.

FIG. 17 is a sectional view of one embodiment of a filtration apparatus 130, which can be installed in the body or lid (e.g., lid 106 of FIG. 8) of a reactant source vessel. The illustrated apparatus 130 is a filter formed of a flange 132, a filter media 134, and a fastener element 136. In this embodiment, the filter 130 is sized and shaped to fit closely into a recess 138 of the vessel's lid (e.g., lid 106 of FIG. 8). The perimeter of the flange 132 can be circular, rectangular, or other shapes, and the shape preferably conforms tightly to the perimeter of the recess 138. The filter material 134 is configured to restrict the passage of gas-entrained particles greater than a certain size through an opening defined by an annular inner wall 140 of the flange 132. The material 134 preferably blocks the entire opening defined by the wall 140. The material 134 can comprise any of a variety of different materials, and in one embodiment is a high flow sintered nickel fiber media. In other embodiments, the filter media is manufactured from other metals (e.g., stainless steel), ceramics (e.g., alumina), quartz, or other materials typically incorporated in gas or liquid filters. The material 134 is preferably welded or adhered to the annular wall 140. In one embodiment, the filter 130 comprises a surface-mount sandwich filter, such as those sold by TEM Products of Santa Clara, Calif.

In the illustrated embodiment, the fastener element 136 comprises a spring snap ring that biases the flange 132 against a wall 146 of the lid 106. The ring 136 preferably fits closely within an annular recess 142 in the perimeter of the recess 138. The snap ring 136 can comprise, for example, a flat wire compression spring, such as the Spirawave® wave springs sold by Smalley Steel Ring Company of Lake Zurich, Ill. Additional and different types of fastener elements can be provided to fasten the filter 130 to the lid 106. Preferably, the fastener element 136 prevents the flow of carrier gas and reactant vapor through the interface between the flange 132 and the lid 106, such that all of the gas must flow through the filter material 134. A sub-recess 147 can be provided to define a plenum 148 on an outlet side of the filter 130, which can improve the quality of the filtered gas flow. The illustrated filter 130 is easily replaceable, simply by removing the snap ring 136 from the annular recess 142, removing the filter 130 from the recess 138, inserting a new filter 130, and reinserting the snap ring 136 into the annular recess 142.

The filter recess 138 is preferably located closely to one of the isolation valves of the precursor source vessel. In the embodiment of FIG. 17, the recess 138 is directly below the valve porting block 120 of the outlet isolation valve 110 (FIG. 1) of the source vessel 100. Skilled artisans will understand that individual filters 130 may be provided in association with each isolation valve of the vessel, including the inlet valve 108 and the vent valve 210 (FIGS. 26-28). A passage 145 extends from the plenum 148 to a passage 144 of the valve porting block 120. In the illustrated embodiment, the porting block 120 is formed separately from the vessel lid 106, and a seal is preferably provided therebetween. In another embodiment, the block 120 is formed integrally with the lid 106 and the passages 144 and 145 are formed in the same drilling operation.

Figure 18:
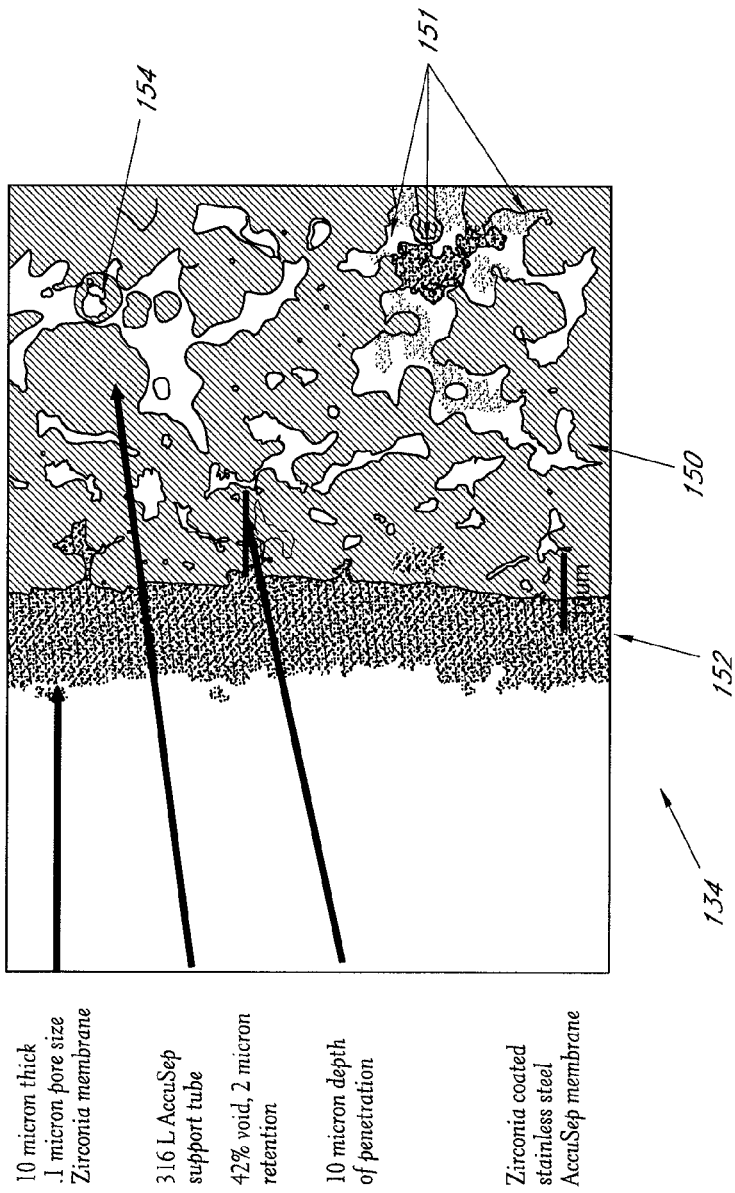
FIG. 18 is an embodiment of a filter material that can be used for the filter of FIG. 17.

FIG. 18 is a magnified sectional view a surface portion of a filter material 134 in accordance with one embodiment. In this embodiment, the filter material 134 includes a large particle filtration layer 150 and a small particle filtration layer 152. The large particle filtration layer 150 preferably filters relatively larger particles, and the small particle filtration layer 152 preferably filters relatively smaller particles. The large particle filtration layer 150 includes a plurality of voids 151. In one embodiment, the large particle filtration layer 150 is about 20-60% void, and more preferably 30-50% void. In one embodiment, the large particle filtration layer 150 is about 42% void. The large particle filtration layer 150 can comprise, for example, a stainless steel material. The large particle filtration layer 150 preferably comprises a majority of the filter material 134. Due to the voids 151, the filter material 134 produces a relatively low pressure drop. One or more support tubes 154 can be provided for enhanced structural rigidity of the large particle filtration layer 150. The small particle filtration layer 152 can have a pore size of 0.05-0.2 microns, and more preferably about 0.10 microns. The small particle filtration layer 152 can have a thickness of about 5-20 microns, and more preferably about 10 microns. The small particle filtration layer 152 may comprise, for example, a coating of Zirconia. Each side of the large particle filtration layer 150 can be coated with a small particle filtration layer 152. A suitable filter material is one that is similar to an AccuSep filter sold by Pall Corporation.

Gas Interface Assembly

Figure 19:
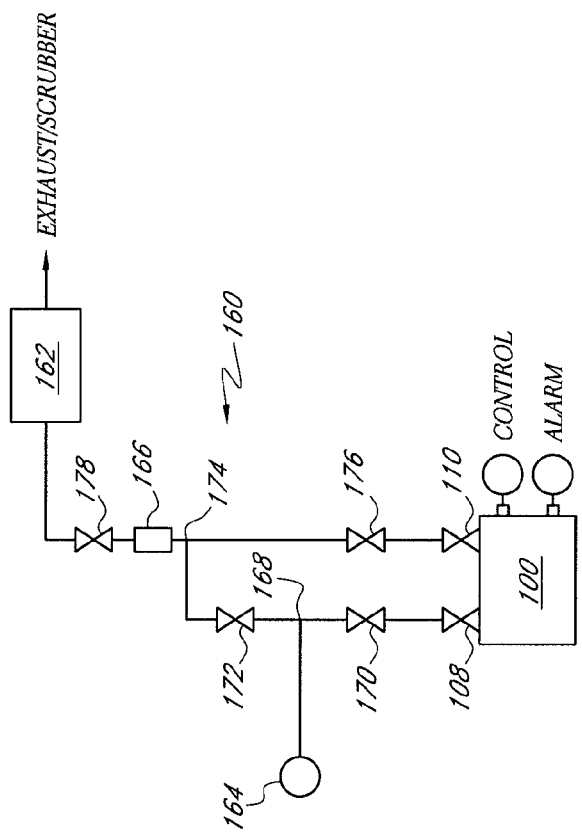
FIG. 19 is a schematic illustration of a gas delivery system for flowing carrier and reactant gases through a precursor source vessel and a vapor phase reaction chamber.

FIG. 19 is a schematic illustration of a gas delivery system 160 that can be used to flow carrier and reactant gases through the precursor source vessel 100 and a vapor phase reaction chamber 162. The delivery system 160 includes the vessel 100, a carrier gas source 164, a downstream purifier or filter 166, and several additional valves, as described herein. The isolation valves 108, 110 are preferably surface-mounted on the vessel 100 as described above. The carrier gas source 164 is operable to deliver an inert carrier gas to a connection point 168. A valve 170 is interposed between the connection point 168 and the vessel inlet valve 108. A valve 172 is interposed between the connection point 168 and a connection point 174. A valve 176 is interposed between the connection point 174 and the vessel outlet valve 110. The purifier 166 and an additional valve 178 are interposed between the connection point 174 and the reaction chamber 162. As illustrated, the vessel 100 can have appropriate control and alarm interfaces, displays, panels, or the like.

When it is desirable to flow the carrier gas through the vessel 100 and to the reaction chamber 162, the valves 170, 108, 110, 176, and 178 are opened and the valve 172 is closed. Conversely, when it is desirable for the carrier gas to bypass the vessel 100 on its way to the reaction chamber 162, the valves 172 and 178 are opened, and preferably all of the valves 170, 108, 110, and 176 are closed. The valve 178 can be used to isolate the reaction chamber 162 from the gas delivery system 160, e.g. for maintenance and repair.

With reference again to FIG. 7, a precursor gas delivery system (such as that shown in FIG. 19) can be embodied in a gas interface assembly 180 that facilitates control of the flow of carrier gas and reactant vapor through the vessel 100 and an associated vapor phase reaction chamber. The illustrated gas interface assembly 180 includes a plurality of valves 182 (which can perform substantially the same functions as the valves 170, 172, 176, and 178 of FIG. 19), a downstream purifier or filter 184, and a heater plate 186. The valves 182 can include valve porting blocks 188 similar in principle and operation to the valve porting blocks 118 and 120.

With reference to FIGS. 7 and 19, a gas line 133 extends from one of the valves 182 that receives carrier gas from a carrier gas source 164. For example, the valve 182 from which the gas line 133 extends can perform substantially the function of valve 170 of FIG. 19. FIG. 7 does not show the gas line extending into such a valve from the carrier gas source, but it will be understood to be provided. The gas line 133 includes a fitting 131 that connects to the carrier gas inlet fitting 122 of the vessel 100 when the vessel and the gas interface assembly 180 are connected. An outlet 135 of the gas interface assembly 180 delivers gas to a reaction chamber 162. It will be understood that the source vessel's carrier gas inlet could be configured to be similar to the outlet orifice 128.

With continued reference to FIG. 7, the heater plate 186 heats up the valves 182 and the vessel 100, preferably to a temperature above the vaporization temperature of the precursor. The high level of thermal contact between the various valves, valve porting blocks, and gas conduits of the preferred embodiment, as well as the proximity of the heater plate 186 to these components, reduces the total heat required to prevent condensation of the precursor in the gas-conveying components downstream of the vessel 100. The heater plate 186 can be heated by a variety of different types of heaters, such as cartridge heaters or line heaters. The heater plate can be formed of a variety of materials, such as aluminum, stainless steel, titanium, or various nickel alloys. Thermofoil-type heaters can also be used to heat the heater plate 186 and valve porting blocks 188. The use of a thermofoil-type heater can allow variable watt density or more than one temperature control zone. Incorporation of variable watt density or multiple temperature control zones on the heater plate 186 can make it possible to induce a temperature gradient along the flow path of the gas. This can provide a gradual heating of the reactant vapor as it moves downstream, so that condensation is avoided. Suitable thermofoil heaters are sold by Minco of Minneapolis, Minn. Additional heaters (including line heaters, cartridge heaters, radiant heat lamps, and thermofoil-type heaters) can also be provided to heat the vessel lid 106 and container body 104.

In certain embodiments, a dedicated heater can be provided to heat the vessel 100. In one particular embodiment, shown in FIG. 18 (described in further detail below), a dedicated heating device 220 is provided beneath a lower surface of the vessel's container body 104.

As mentioned above, precursor vapor can also be drawn from the vessel 100 by the "vapor draw" and external gas flow methods. In the vapor draw method, a vacuum is applied to the vessel 100 to draw out the vapor. For example, the vacuum can be applied downstream of the reaction chamber 162, with the valves 110, 176, and 178 open and the valves 108, 170, and 172 closed. The vacuum can be applied, for example, by using a vacuum pump. In the external gas flow method, the precursor vapor can be drawn from the vessel 100 by flowing the carrier gas from the source 164 to the reaction chamber 162, with the valves 110, 172, 176, and 178 open and the valves 108 and 170 closed. Under certain conditions, this can create a pressure differential between the vessel 100 and the flow path of the carrier gas, which causes the precursor vapor to flow toward the reaction chamber.

Quick-Connection Assembly

With continued reference to FIG. 7, the quick-connection assembly 102 preferably facilitates quicker and easier loading, aligning, and connection of the precursor source vessel 100 to the gas interface assembly 180. The quick-connection assembly 102 is ergonomically friendly and facilitates replacement, recharging, and serviceability of the vessel 100. A variety of different types of quick-connection assemblies can be provided, keeping in mind these goals, and skilled artisans will understand that the illustrated assembly 102 is merely one embodiment. The quick-connection assembly 102 can be incorporated into the vacuum enclosure where the source vessel 100 and supporting control hardware are packaged.

Figure 20:
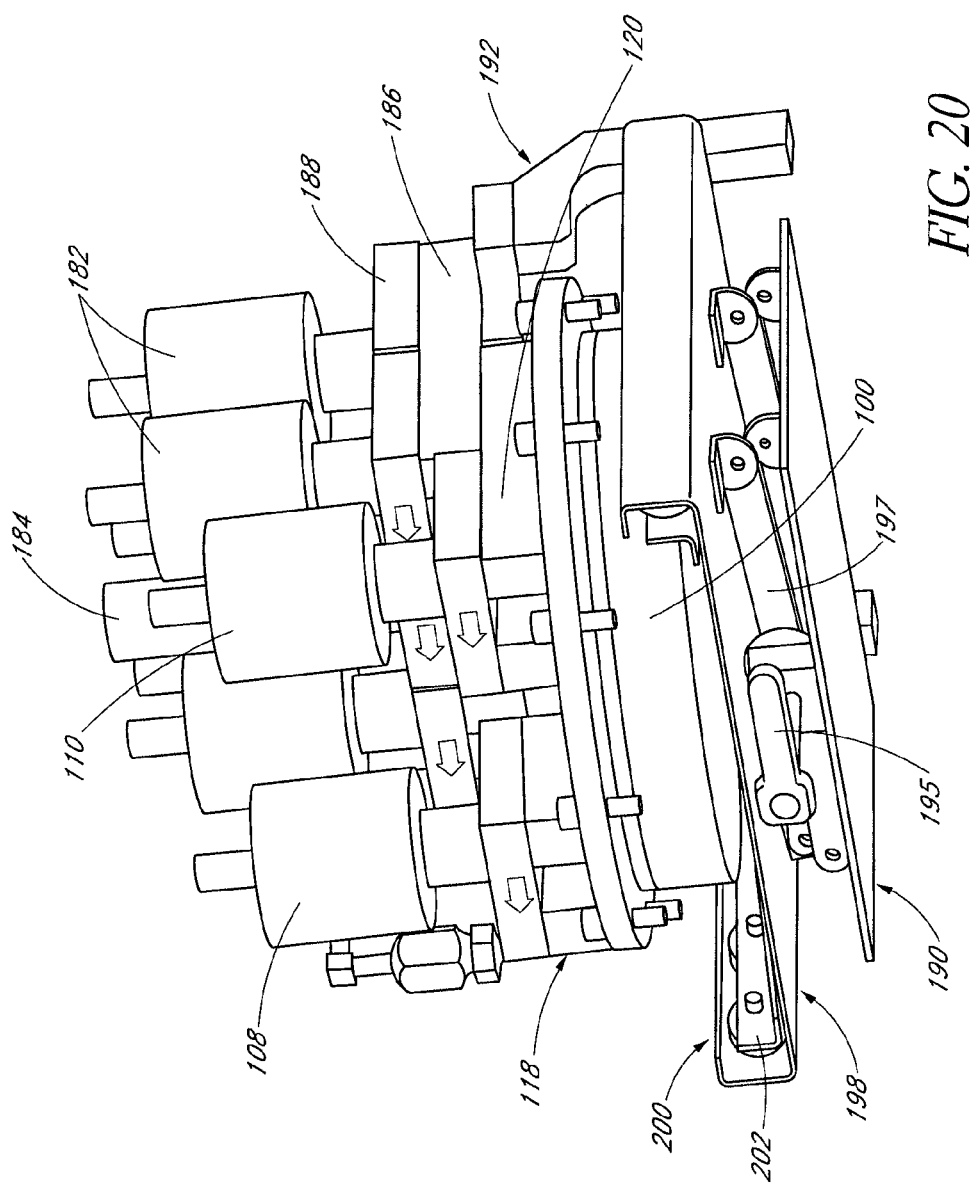
FIGS. 20 and 21 are front perspective views of the vessel and gas interface assembly of FIG. 7, shown connected.
Figure 21:
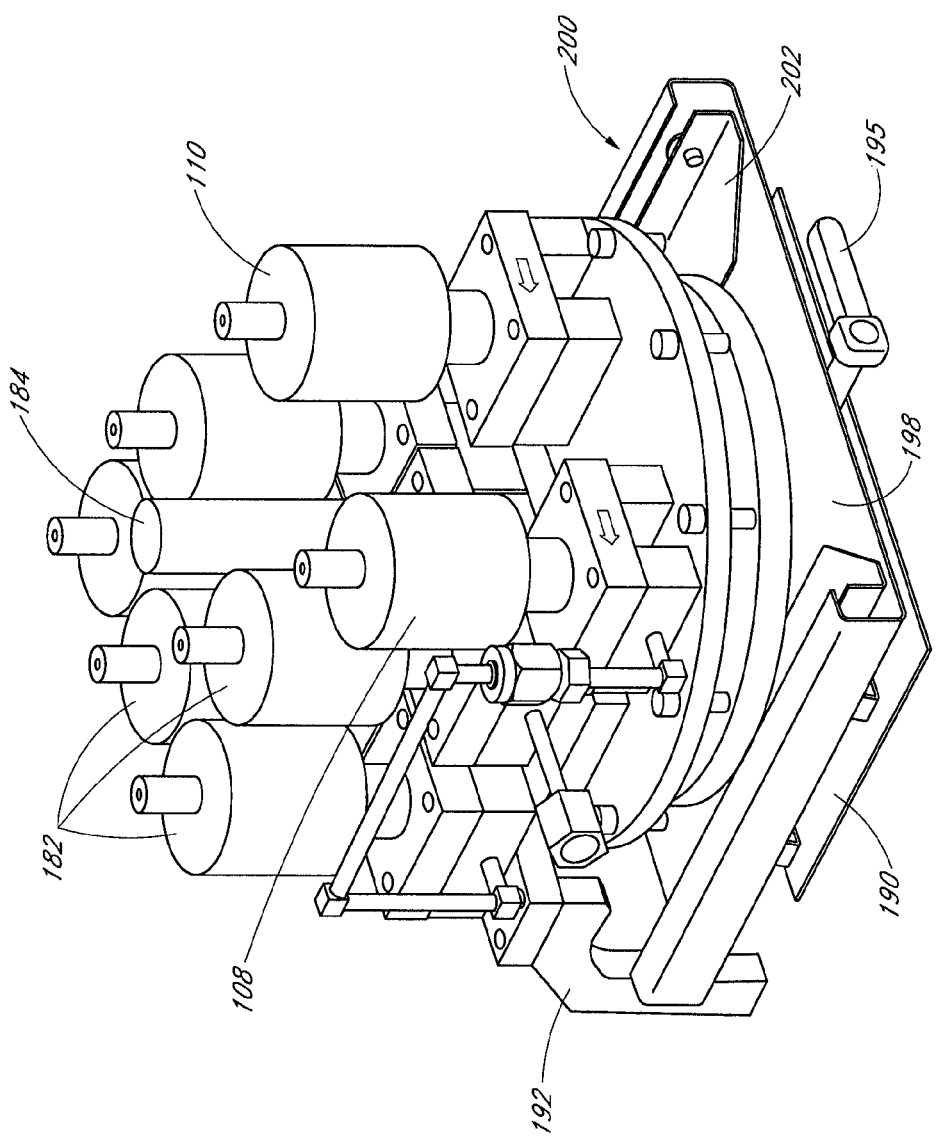

With reference to FIGS. 7, 20, and 21, the illustrated quick-connection assembly 102 includes a base 190, a pedestal 192 extending upward from an edge of the base 190, a track component 194, and a lift assembly 196. The base 190 can preferably be secured to a lower inner surface of the gas delivery system 6 (FIG. 1), such as on the floor 9 of the reactant source cabinet 16. Preferably, the pedestal 192 is connected to and supports the gas interface assembly 180 at a position above the base 190. The track component 194 includes a platform 198 and two roller tracks 200 on opposite sides of the platform 198. A pair of roller assemblies 202 having aligned rollers 204 is preferably secured to opposite sides of the vessel 100. In this embodiment, the rollers 204 are sized and configured to roll within the tracks 200 of the track component 194, so that the vessel 100 can be easily and quickly positioned on the platform 198.

When the vessel 100 is loaded onto the platform 198 with the roller assemblies 202 engaged with the tracks 200, the outlet of the outlet valve 110 is preferably vertically aligned with an inlet of one of the valves 182 of the gas interface assembly 180. The lift assembly 196 is configured to move the platform 198 vertically between lowered (shown in FIG. 7) and raised positions (shown in FIGS. 20-21). When the vessel 100 is loaded onto the platform 198 and the platform is moved to its raised position, the outlet of the outlet valve 110 preferably communicates, either directly or indirectly, with an inlet of one of the valves 182. A minimal degree of manual adjustment may be required to suitably seal the interface between the outlet of the outlet valve 110 and the inlet of the valve 182. In the illustrated embodiment, the outlet of the outlet valve 110 is an orifice 128 in the valve porting block 120. In this manner, the quick-connection assembly 102 enables quick connection of the precursor source vessel 100 and the gas interface assembly 180.

As shown in FIG. 20, the illustrated lift assembly 196 comprises a lift handle 195 that can manually actuate scissor legs 197 to vertically move the platform 198. For example, the handle 195 and legs 197 can operate in a manner that is similar to some existing auto jacks. In one embodiment, the lift assembly 196 lifts the platform 198 to its raised position when the handle 195 is rotated approximately 180°. However, it will be appreciated that other types of lift devices can alternatively be provided.

The quick-connection assembly 102 makes it easier to exchange a depleted vessel 100 with a new vessel. In addition, since the assembly 102 simplifies vessel removal and installation, it is also easier to perform routine maintenance on the vessel 100. Preferably, the weight of the vessel 100 is such that it can be easily managed by a single technician.

Figure 22:
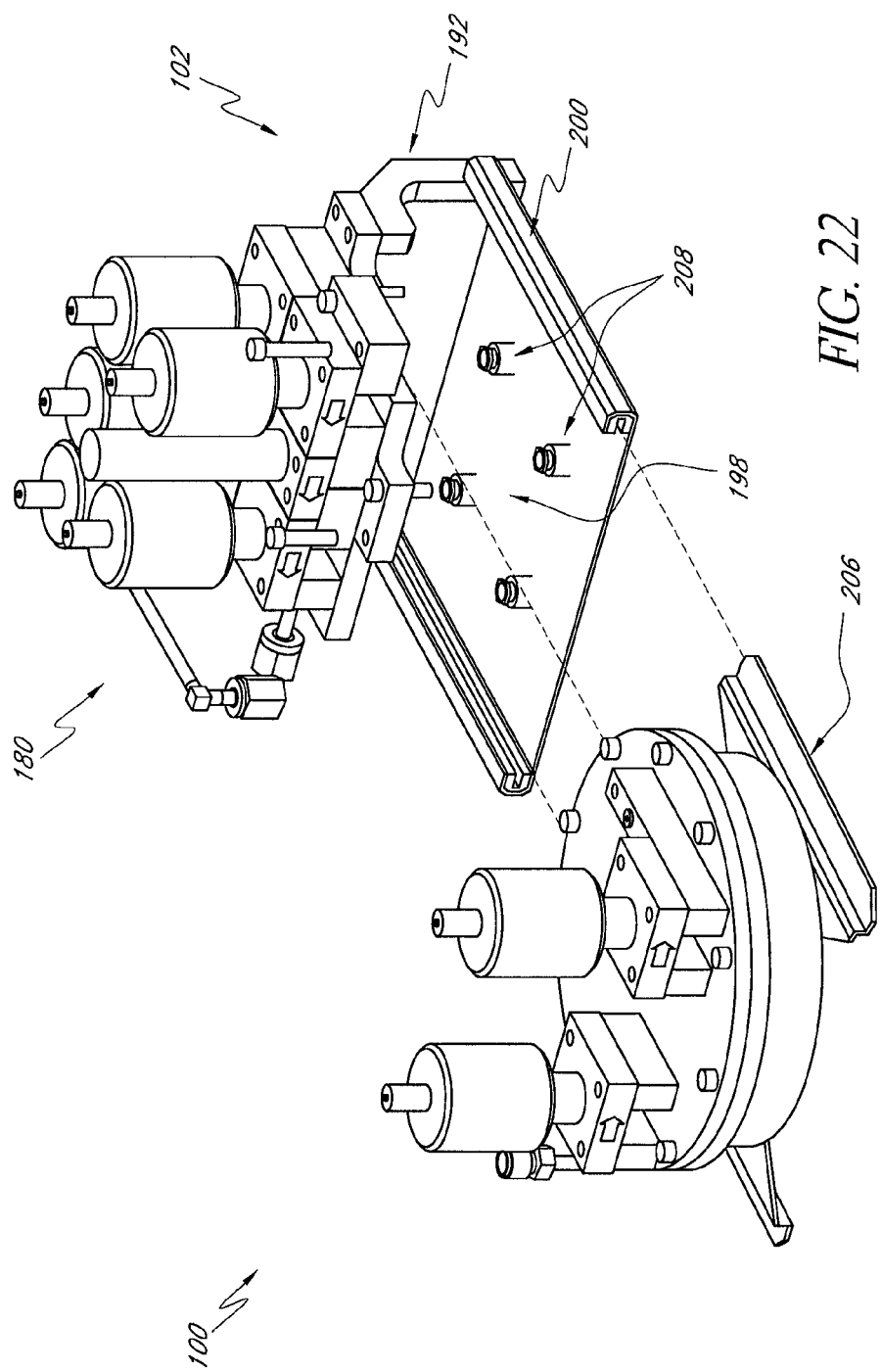
FIG. 22 is a top front perspective view of the precursor source vessel and gas interface assembly of FIG. 7, with an alternative embodiment of a quick-connection assembly.
Figure 23:
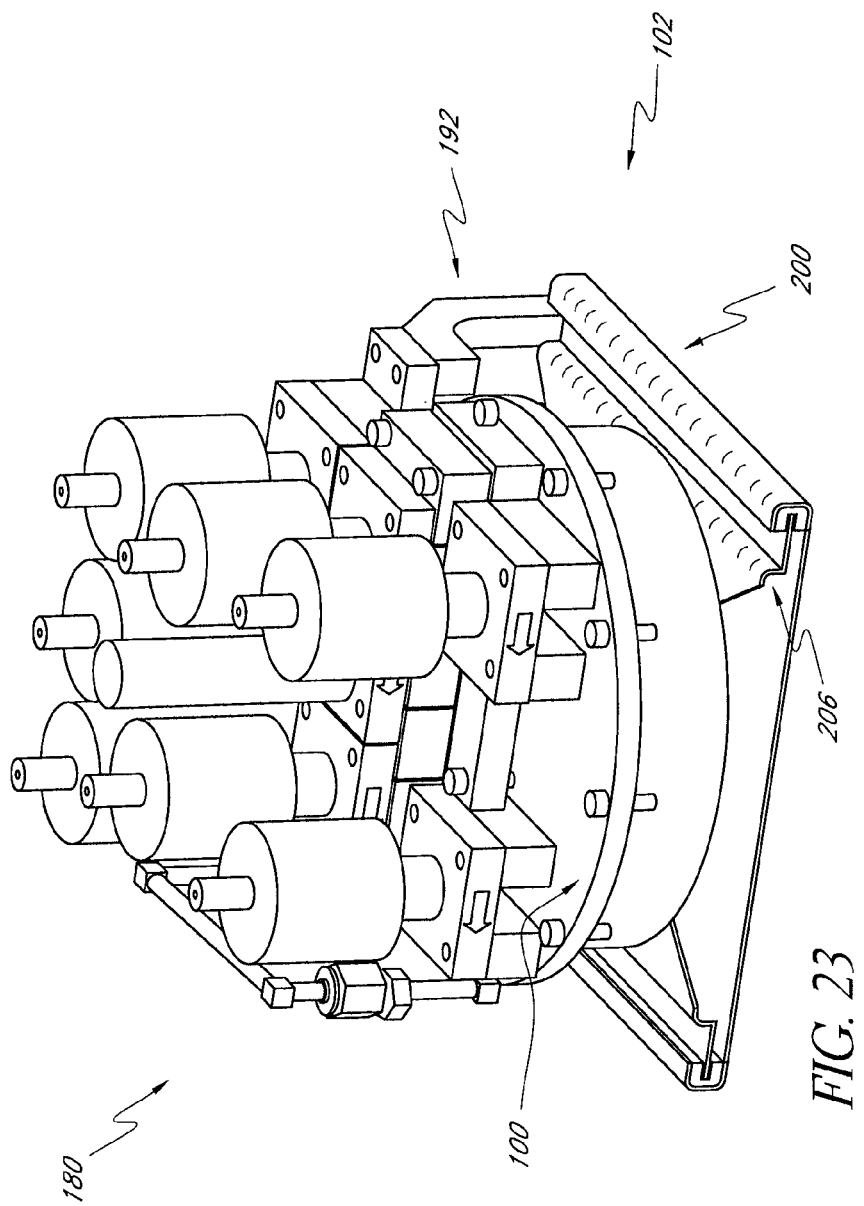
FIG. 23 is a top front perspective view of the vessel and gas interface assembly of FIG. 22, shown connected.
Figure 24:
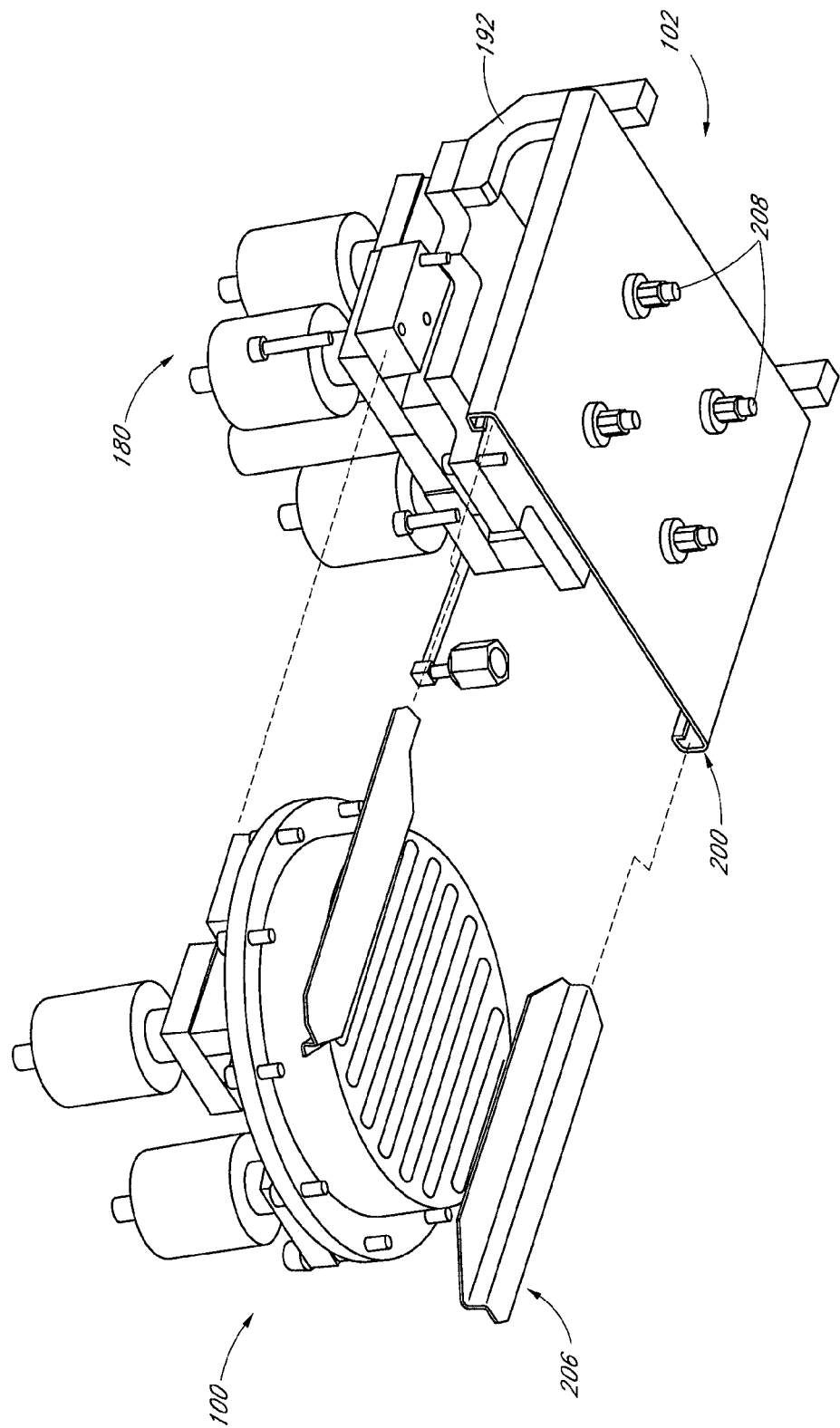
FIG. 24 is a bottom front perspective view of the vessel and gas interface assembly of FIG. 22, shown separated.

FIGS. 22-24 show an alternative embodiment of a quick-connection assembly 102. The illustrated assembly 102 includes the platform 198 and pedestal 192. The platform 198 includes tracks 200 adapted to receive tongues 206 attached on opposite sides of the vessel 100. One or more lift devices 208 are provided to raise the platform 198. In the illustrated embodiment, the lift devices 208 comprise bolts underneath the platform 198. The bolts can be turned to cause the platform 198 to rise to the connection position associated with the vessel 100. A guide apparatus (not shown) can be provided to maintain the vertical alignment of the platform 198.

Vent Valve

As mentioned above, precursor source vessels are typically supplied with a head pressure of inert gas (e.g., helium) in the vessel. During venting, or "burping," of this head pressure down to typical process pressures, solid precursor particles become aerosolized and entrained in the inert gas outflow. This can contaminate the gas delivery system because such gas is typically vented out through the vessel's outlet isolation valve, the reactant gas delivery system, and ultimately the reactor's exhaust/scrubber. Later, during substrate processing, the contaminated portions of the gas panel that are common to the precursor delivery path and the vent path can cause processing defects during ALD on the substrate.

FIG. 26 shows an example of a precursor source vessel 100 that includes a vent valve 210. In this embodiment, the vent valve 210 is positioned intermediate the inlet isolation valve 108 and the outlet isolation valve 110. However, skilled artisans will appreciate that other arrangements are possible. Preferably, the vent valve 210 includes a valve porting block 212, which can be substantially similar to the valve porting blocks 118 and 120. FIG. 27 shows the vessel 100 of FIG. 26 connected to the gas interface assembly of FIGS. 22-24, as described above.

FIG. 28 is a sectional view of an embodiment of the vessel 100 of FIG. 26. As noted above, the vessel 100 includes a container body 104, a serpentine insert 112, a spring 114, and a vessel lid 106. The vessel lid 106 includes the surface-mounted isolation valves 108 and 110, as well as the preferably surface-mounted isolation valve 210. Preferably, the valves 108, 210, and 110 include valve porting blocks 118, 212, and 120, respectively. FIG. 28 also shows internal gas passages 214 of the valve porting blocks. As noted above, the valve porting block 120 includes a gas outlet 128 that supplies the precursor vapor and carrier gas to the gas interface assembly 180.

A filter is preferably associated with each of the valves 108, 210, and 110. In the illustrated embodiment, the vessel lid 106 includes a filter 130 (e.g., as shown in FIG. 17 and described above) associated with each valve. It will be appreciated that a variety of different types of filters can be used. The filters prevent precursor particles from exiting the vessel 100.

While preferred embodiments of the present invention have been described, it should be understood that the present invention is not so limited and modifications may be made without departing from the present invention. The scope of the present invention is defined by the appended claims, and all devices, process, and methods that come within the meaning of the claims, either literally or by equivalence, are intended to be embraced therein.

What is claimed is:

1. A precursor source vessel comprising:
   a lid having an upper surface comprising inlet port, an outlet port, and a burp port;
   a surface-mounted inlet valve in fluid communication with the inlet port;
   a surface-mounted outlet valve in fluid communication with the outlet port;
   a surface-mounted burp valve in fluid communication with the burp port;
   a base removably attached to said lid, said base having a recessed region formed therein, said recessed region comprising an inlet recessed pad, an outlet recessed pad, a burp recessed pad, and a channel integrally formed within said base; and
   a filtration apparatus connected to a bottom surface of said lid.

2. The precursor source vessel of claim 1, wherein said channel fluidly connects the inlet recessed pad, the outlet recessed pad, and the burp recessed pad.

3. The precursor source vessel of claim 2, wherein said channel includes a plurality of linear sections.

4. The precursor source vessel of claim 3, wherein at least two of said linear sections are adjacent and substantially parallel.

5. The precursor source vessel of claim 2, wherein said channel includes a plurality of arced sections.

6. The precursor source vessel of claim 5, wherein at least two of said arced sections are adjacent and substantially concentric.

7. The precursor source vessel of claim 1 further comprising a seal disposed between the lid and the base.

8. The precursor source vessel of claim 1, wherein a depth of the channel is greater than a depth of any of the inlet recessed pad, the outlet recessed pad, and the burp recessed pad.

9. The precursor source vessel of claim 1, wherein each of said inlet valve, said outlet valve, and said burp valve is mounted flush with an upper surface of said lid.

10. The precursor source vessel of claim 1, wherein said channel is machined into said base.

11. The precursor source vessel of claim 1, wherein said channel is a tortuous pathway.

12. A precursor source vessel comprising:
   a base having a recessed region integrally formed therein, said recessed region comprising an inlet recessed pad, an outlet recessed pad, a burp recessed pad, and a channel, said inlet recessed pad, said outlet recessed pad, and said burp recessed pad extending downwardly from a contact surface of said base;
   a lid removably attached to said base, said lid having an upper surface comprising an inlet port, an outlet port, and a burp port; and
   a burp valve operatively attached to said lid, and wherein said burp valve is operatively connected to said burp port.

13. The precursor source vessel of claim 12 further comprising a burp filter mounted flush with an upper surface of said lid adjacent to said burp port.

14. The precursor source vessel of claim 12, wherein said burp port is directly fluidly connected to a burp gas line that bypasses a reaction chamber.

15. A precursor source vessel comprising:
   a base having a bottom surface, a contact surface, a side surface extending between said contact and bottom surfaces, and an inner surface extending from said contact surface to define a recessed region within said base, said recessed region comprising an inlet recessed pad, an outlet recessed pad, a burp recessed pad, and a channel integrally formed within said base;
   a lid removably attached to said base, said lid having an upper surface comprising an inlet port, an outlet port, and a burp port.

16. The precursor source vessel of claim 15, wherein said lid includes an upper surface, a lower surface and a side surface extending between said upper and lower surfaces, and wherein said lower surface of said lid is in an abutting relationship with said contact surface of said base when said lid is attached to said base.

17. The precursor source vessel of claim 16 further comprising an interior volume defined between said inner surface of said base and said lower surface of said lid.

18. The precursor source vessel of claim 15, wherein said recessed region provides a fluid pathway between said inlet port and said outlet port.

19. The precursor source vessel of claim 18 wherein said inlet recessed pad, said outlet recessed pad, and said channel are machined into said base.

20. The precursor source vessel of claim 19, wherein said channel includes a plurality of linear sections.

21. The precursor source vessel of claim 20, wherein at least two of said linear sections are adjacent and substantially parallel.

22. The precursor source vessel of claim 19, wherein said channel includes a plurality of arced sections.

23. The precursor source vessel of claim 22, wherein at least two of said arced sections are adjacent and substantially concentric.

24. The precursor source vessel of claim 15 further comprising a heating assembly disposed within said base.

25. A precursor source vessel comprising:
   a lid having an upper surface comprising a first port, a second port, and a third port; and a base removably attached to said lid, said base having a recessed region formed therein, said base comprising an inlet recessed pad, an outlet recessed pad, a burp recessed pad, and a channel integrally formed within said base.

* * * * *